(12) United States Patent
Tzeng et al.

(10) Patent No.: US 10,868,105 B2
(45) Date of Patent: Dec. 15, 2020

(54) PROCESS FOR TUNING VIA PROFILE IN DIELECTRIC MATERIAL

(71) Applicant: Taiwan Semiconductor Manufacturing Company, Ltd., Hsinchu (TW)

(72) Inventors: Chun Kai Tzeng, Tainan (TW); Cheng Jen Lin, Kaohsiung (TW); Yung-Ching Chao, Gukeng Township (TW); Ming-Da Cheng, Jhubei (TW); Mirng-Ji Lii, Sinpu Township (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/289,831

(22) Filed: Mar. 1, 2019

(65) Prior Publication Data

US 2020/0127078 A1 Apr. 23, 2020

Related U.S. Application Data

(60) Provisional application No. 62/748,827, filed on Oct. 22, 2018.

(51) Int. Cl.
| | |
|---|---|
| *H01L 21/8222* | (2006.01) |
| *H01L 49/02* | (2006.01) |
| *H01L 21/311* | (2006.01) |
| *H01L 23/522* | (2006.01) |

(52) U.S. Cl.
CPC ........ *H01L 28/10* (2013.01); *H01L 21/31133* (2013.01); *H01L 21/31144* (2013.01); *H01L 23/5227* (2013.01)

(58) Field of Classification Search
CPC .................................................. H01L 23/5227
See application file for complete search history.

(56) References Cited

U.S. PATENT DOCUMENTS

| | | | |
|---|---|---|---|
| 10,020,195 B2 | 7/2018 | Scheer et al. | |
| 2004/0087163 A1* | 5/2004 | Steimle .................. | B82Y 10/00 438/694 |
| 2018/0173096 A1 | 6/2018 | Zi et al. | |

FOREIGN PATENT DOCUMENTS

| | | |
|---|---|---|
| KR | 20040004879 A | 1/2004 |
| TW | 200416815 A | 9/2004 |
| TW | 201541194 A | 11/2015 |
| TW | 201830472 A | 8/2018 |

\* cited by examiner

*Primary Examiner* — Samuel A Gebremariam
(74) *Attorney, Agent, or Firm* — Slater Matsil, LLP

(57) ABSTRACT

A method of forming an integrated circuit structure includes forming a first magnetic layer, forming a first conductive line over the first magnetic layer, and coating a photo-sensitive coating on the first magnetic layer. The photo-sensitive coating includes a first portion directly over the first conductive line, and a second portion offset from the first conductive line. The first portion is joined to the second portion. The method further includes performing a first light-exposure on the first portion of the photo-sensitive coating, performing a second light-exposure on both the first portion and the second portion of the photo-sensitive coating, developing the photo-sensitive coating, and forming a second magnetic layer over the photo-sensitive coating.

20 Claims, 21 Drawing Sheets

PROCESS FOR TUNING VIA PROFILE IN DIELECTRIC MATERIAL

PRIORITY CLAIM AND CROSS-REFERENCE

This application claims the benefit of the following provisionally filed U.S. Patent application: Application Ser. No. 62/748,827, filed Oct. 22, 2018, and entitled "Inductors Having Magnetic Shells and Methods Forming Same;" which application is hereby incorporated herein by reference.

BACKGROUND

Inductors are important components in integrated circuits. Inductors, however, do not scale well, and the downscaling of the inductors in integrated circuits often incurs the penalty of the downgrading in performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
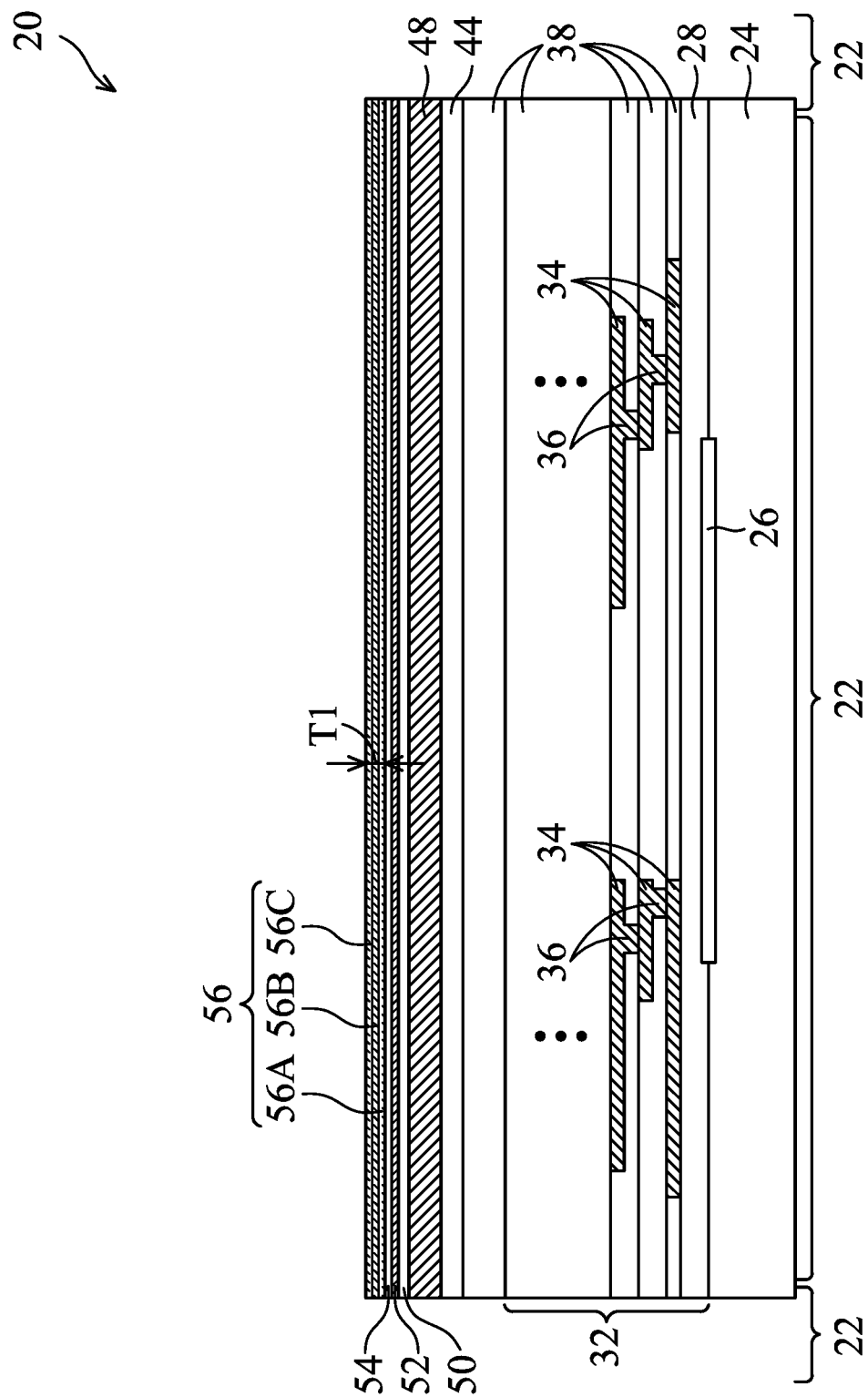
FIGS. 1-7, 8A, 8B, and 9-14 illustrate the cross-sectional views of intermediate stages in the formation of an inductor in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An inductor and the method of forming the same in a die/wafer are provided in accordance with some embodiments. The intermediate stages in the formation of the inductor are illustrated in accordance with some embodiments. Some variations of some embodiments are discussed. Throughout the various views and illustrative embodiments, like reference numbers are used to designate like elements. In accordance with some embodiments of the present disclosure, the inductor includes a dielectric material separating a magnetic material from conductive lines in the inductor. The dielectric material includes a negative photo-sensitive material, which is patterned using a double-exposure process followed by a single development process, and the sidewalls of the dielectric material have a tapered profile.

Figure 20:
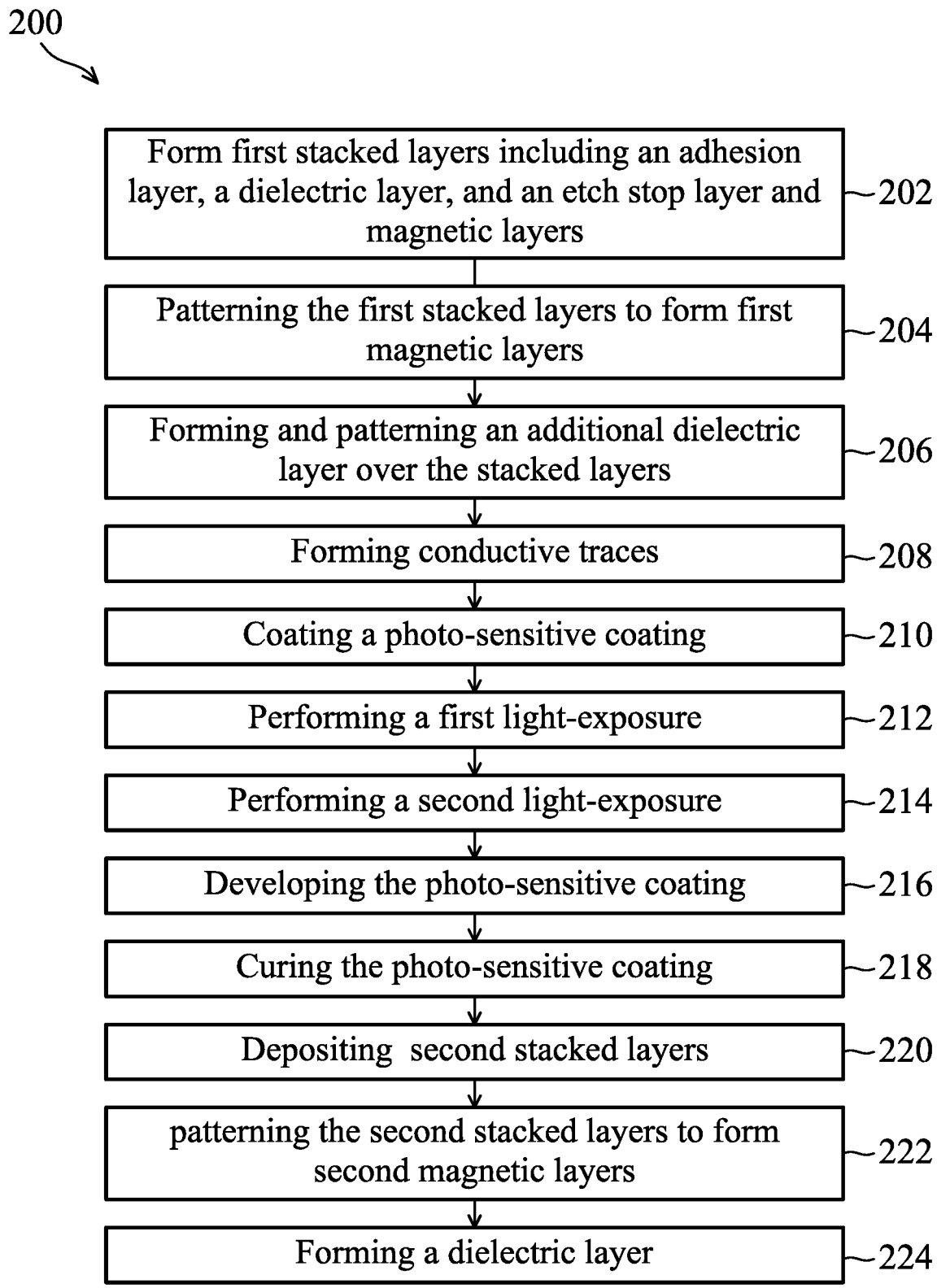
FIG. 20 illustrates a process flow for forming an inductor in accordance with some embodiments.

FIGS. 1 through 7, 8A, 8B, and 9 through 14 illustrate the cross-sectional views of intermediate stages in the formation of an inductor in a device wafer (and die) in accordance with some embodiments of the present disclosure. The corresponding processes are also reflected schematically in the process flow 200 as shown in FIG. 20.

FIG. 1 illustrates a cross-sectional view of package component 20. Package component 20 includes a plurality of package components 22 therein. In accordance with some embodiments of the present disclosure, package component 20 is a device wafer including integrated circuit devices 26, which may include active devices and possibly passive devices. In accordance with alternative embodiments of the present disclosure, package component 20 is an interposer wafer, which does not include active devices, and may or may not include passive devices. In accordance with yet alternative embodiments of the present disclosure, package component 20 is a package substrate strip, which includes a plurality of package substrates. Package component 20 may also be a reconstructed wafer including a plurality of packages therein. In subsequent discussion, a device wafer is discussed as an example package component 20, while the embodiments of the present disclosure may also be applied on interposer wafers, package substrates, packages, reconstructed wafers, etc.

In accordance with some embodiments of the present disclosure, package component 20 includes semiconductor substrate 24 and the features formed at a top surface of semiconductor substrate 24. Semiconductor substrate 24 may be formed of crystalline silicon, crystalline germanium, silicon germanium, or a III-V compound semiconductor such as GaN, GaAsP, AlInAs, AlGaAs, GaInAs, GaInP, GaInAsP, or the like. Semiconductor substrate 24 may also be a bulk semiconductor substrate or a Semiconductor-On-Insulator (SOI) substrate. Shallow Trench Isolation (STI) regions (not shown) may be formed in semiconductor substrate 24 to isolate the active regions in semiconductor substrate 24. Although not shown in FIG. 1, through-vias (sometimes referred to as through-silicon vias or through-semiconductor vias) may be formed to extend into semiconductor substrate 24, wherein the through-vias are used to electrically inter-couple the features on opposite sides of package component 20.

In accordance with some embodiments of the present disclosure, package component 20 includes integrated circuit devices 26, which may include some portions formed on the top surface of semiconductor substrate 24. Integrated circuit devices 26 may include Complementary Metal-Oxide Semiconductor (CMOS) transistors, resistors, capacitors, diodes, and the like in accordance with some embodiments. The details of integrated circuit devices 26 are not illustrated herein. In accordance with alternative embodiments, package component 20 is used for forming interposers, and substrate 24 may be a semiconductor substrate or a dielectric substrate.

Inter-Layer Dielectric (ILD) 28 is formed over semiconductor substrate 24 and fills the space between the gate stacks of transistors (not shown) in integrated circuit devices 26. In accordance with some embodiments, ILD 28 is formed of Phospho Silicate Glass (PSG), Boro Silicate Glass (BSG), Boron-doped Phospho Silicate Glass (BPSG), Fluorine-doped Silicate Glass (FSG), Tetra Ethyl Ortho Silicate (TEOS) oxide, or the like. In accordance with some embodiments of the present disclosure, ILD 28 is formed using a deposition method such as Plasma-Enhanced Chemical Vapor Deposition (PECVD), Low Pressure Chemical Vapor Deposition (LPCVD), spin-on coating, Flowable Chemical Vapor Deposition (FCVD), or the like.

Contact plugs (not shown) are formed in ILD 28, and are used to electrically connect integrated circuit devices 26 to overlying metal lines and vias. In accordance with some embodiments of the present disclosure, the contact plugs are formed of a conductive material selected from tungsten, aluminum, copper, titanium, tantalum, titanium nitride, tantalum nitride, alloys therefore, and/or multi-layers thereof. The formation of the contact plugs may include forming contact openings in ILD 28, filling a conductive material(s) into the contact openings, and performing a planarization (such as a Chemical Mechanical Polish (CMP) process or a mechanical grinding process) to level the top surfaces of the contact plugs with the top surface of ILD 28.

ILD 28 and the contact plugs may be parts of interconnect structure 32. Interconnect structure 32 further includes metal lines 34 and vias 36, which are formed in dielectric layers 38 (also referred to as Inter-metal Dielectrics (IMDs)). The metal lines at a same level are collectively referred to as a metal layer hereinafter. In accordance with some embodiments of the present disclosure, interconnect structure 32 includes a plurality of metal layers including metal lines 34 that are interconnected through vias 36. Metal lines 34 and vias 36 may be formed of copper or copper alloys, and they can also be formed of other metals. In accordance with some embodiments of the present disclosure, dielectric layers 38 are formed of low-k dielectric materials. The dielectric constants (k values) of the low-k dielectric materials may be lower than about 3.0, for example. Dielectric layers 38 may comprise a carbon-containing low-k dielectric material, Hydrogen SilsesQuioxane (HSQ), MethylSilsesQuioxane (MSQ), or the like. In accordance with some embodiments of the present disclosure, the formation of dielectric layers 38 includes depositing a porogen-containing dielectric material and then performing a curing process to drive out the porogen, and hence the remaining dielectric layers 38 are porous.

The formation of metal lines 34 and vias 36 may include single damascene and/or dual damascene processes. In a single damascene process, a trench is first formed in one of dielectric layers 38, followed by filling the trench with a conductive material. A planarization such as a CMP process is then performed to remove the excess portions of the conductive material higher than the top surface of the corresponding dielectric layer 38, leaving a metal line in the trench. In a dual damascene process, both a trench and a via opening are formed in one of dielectric layers 38, with the via opening underlying and connected to the trench. The conductive material is then filled into the trench and the via opening to form a metal line and a via, respectively. The conductive material may include a diffusion barrier layer and a copper-containing metallic material over the diffusion barrier layer. The diffusion barrier layer may include titanium, titanium nitride, tantalum, tantalum nitride, or the like.

Interconnect structure 32 includes top conductive (metal) features such as metal lines, metal pads, or vias in a top dielectric layer of dielectric layers 38. In accordance with some embodiments, the top dielectric layer is formed of a low-k dielectric material similar to the material of the lower ones of dielectric layers 38. In accordance with other embodiments, the top dielectric layer is formed of a non-low-k dielectric material, which may include silicon nitride, Undoped Silicate Glass (USG), silicon oxide, or the like. The top dielectric layer may also have a multi-layer structure including, for example, two USG layers and a silicon nitride layer in between. The top dielectric layer is sometimes referred to as a passivation layer.

Passivation layer 44 is formed over interconnect structure 32. Passivation layer 44 may be a single layer or a composite layer, and may be formed of a non-porous material. In accordance with some embodiments of the present disclosure, passivation layer 44 is a composite layer including a silicon oxide layer and a silicon nitride layer over the silicon oxide layer.

FIG. 1 also illustrates the formation of dielectric layer 48. In accordance with some embodiments of the present disclosure, dielectric layer 48 is formed of a polymer such as polyimide, polybenzoxazole (PBO), benzocyclobutene (BCB), or the like. Dielectric layer 48 is thus sometimes referred to as a first polymer layer (or polymer-1) while it may also be formed of other materials. In accordance with other embodiments, dielectric layer 48 is formed of an inorganic dielectric material such as silicon oxide, silicon nitride, silicon oxynitride, or the like. Dielectric layer 48 may be formed of a light-sensitive material (such as a photo resist), which may be a negative photo resist or a positive photo resist. The formation and the patterning of dielectric layer 48 may include a light-exposure process and a development process.

FIG. 1 further illustrates the formation of stacked layers 50, 52, 54, and 56 over dielectric layer 48. The respective process is illustrated as process 202 in the process flow shown in FIG. 20. Adhesion layer 50 is formed over dielectric layer 48. In accordance with some embodiments, adhesion layer 50 is formed of titanium, which has a good adhesion to dielectric layer 48. Adhesion layer 50 may be formed using Physical Vapor Deposition (PVD), Chemical Vapor Deposition (CVD), or the like. Dielectric layer 52 is formed over adhesion layer 50. In accordance with some embodiments, dielectric layer 52 is formed of silicon nitride, silicon oxynitride, or the like. Dielectric layer 52 may be formed using Atomic Layer Deposition (ALD), CVD, Plasma Enhance Chemical Vapor Deposition (PECVD), or the like.

Etch stop layer 54 is formed over dielectric layer 52. In accordance with some embodiments, etch stop layer 54 is formed by depositing a metal layer such as a cobalt layer, and then performing an oxidation process such as a plasma oxidation process, a thermal oxidation process, or the like on the metal layer, so that the metal layer is converted into a metal oxide layer such as a cobalt oxide layer. The etch stop layer 54 may also be formed of a tantalum oxide layer or a titanium oxide layer, which may be formed by depositing the corresponding metal layer, and then oxidizing the metal layer.

Magnetic layers 56 are formed over etch stop layer 54. In accordance with some embodiments, magnetic layers 56 include magnetic film (layer) 56A, magnetic film (layer) 56B over magnetic film 56A, and magnetic film (layer) 56C over magnetic film 56B, with materials of magnetic films 56A, 56B, and 56C being formed of different materials. Magnetic layers 56 may also include other layers and materials such as a boron layer. In accordance with some embodiments of the present disclosure, there is a single composite layer including one layer 56A, one layer 56B, and one layer 56C. In accordance with other embodiments of the present disclosure, there are a plurality of composite layers, each include a layer 56A, a layer 56B, and a layer 56C. Accordingly, layers 56A, layers 56B, and layers 56C are formed alternatingly. In accordance with some embodiments, magnetic layers 56A, 56B, and 56C comprise cobalt, zirconium, and tantalum, and are referred to as Co-Zr-Ta films. The total thickness T1 of magnetic layers 56 may be in the range between 2 μm and 10 μm in accordance with some embodiments. Adhesion layer 50, dielectric layer 52, etch stop layer 54, and magnetic layers 56 may be deposited as blanket layers expanding throughout package component 20.

Figure 2:
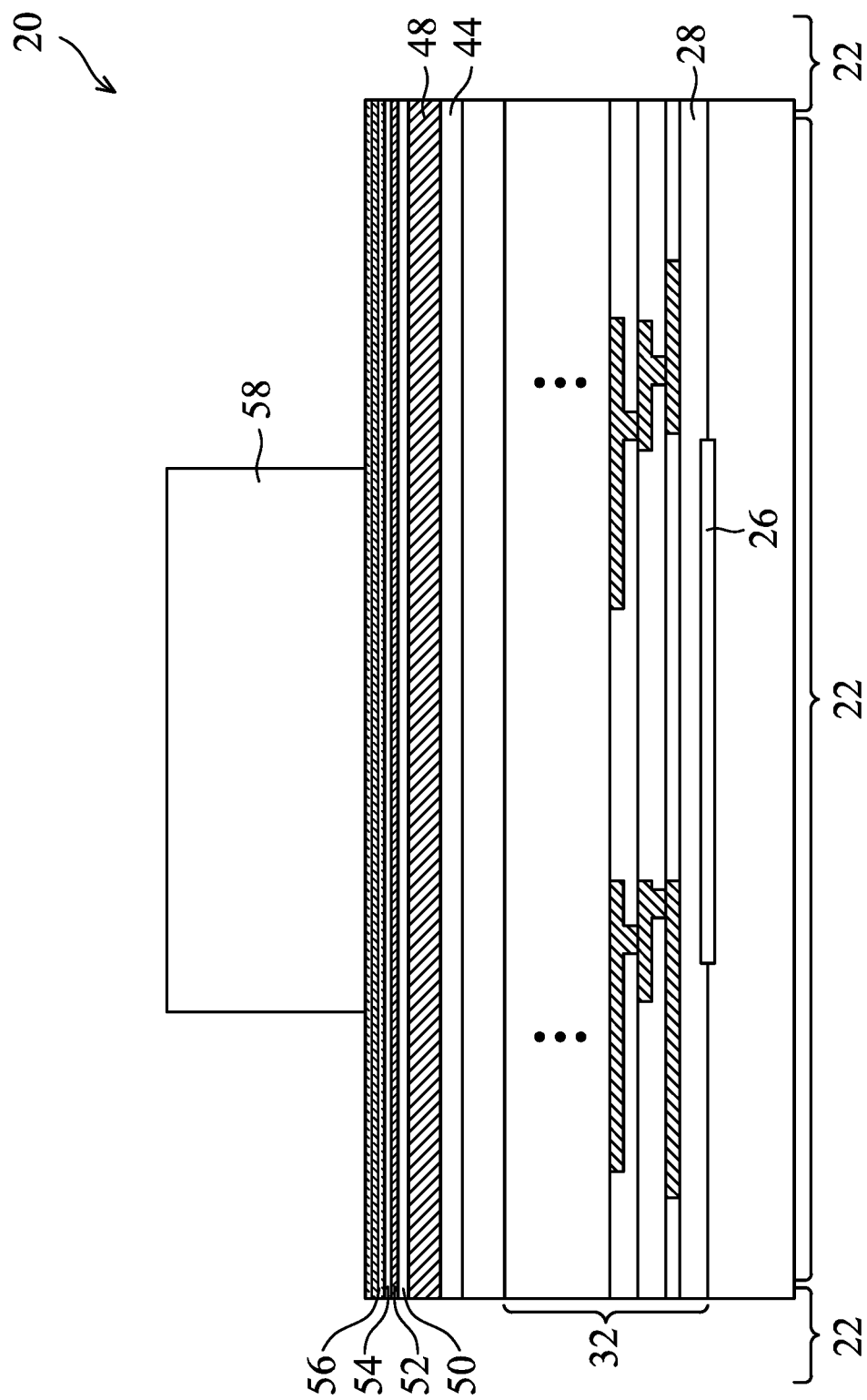
Figure 3:
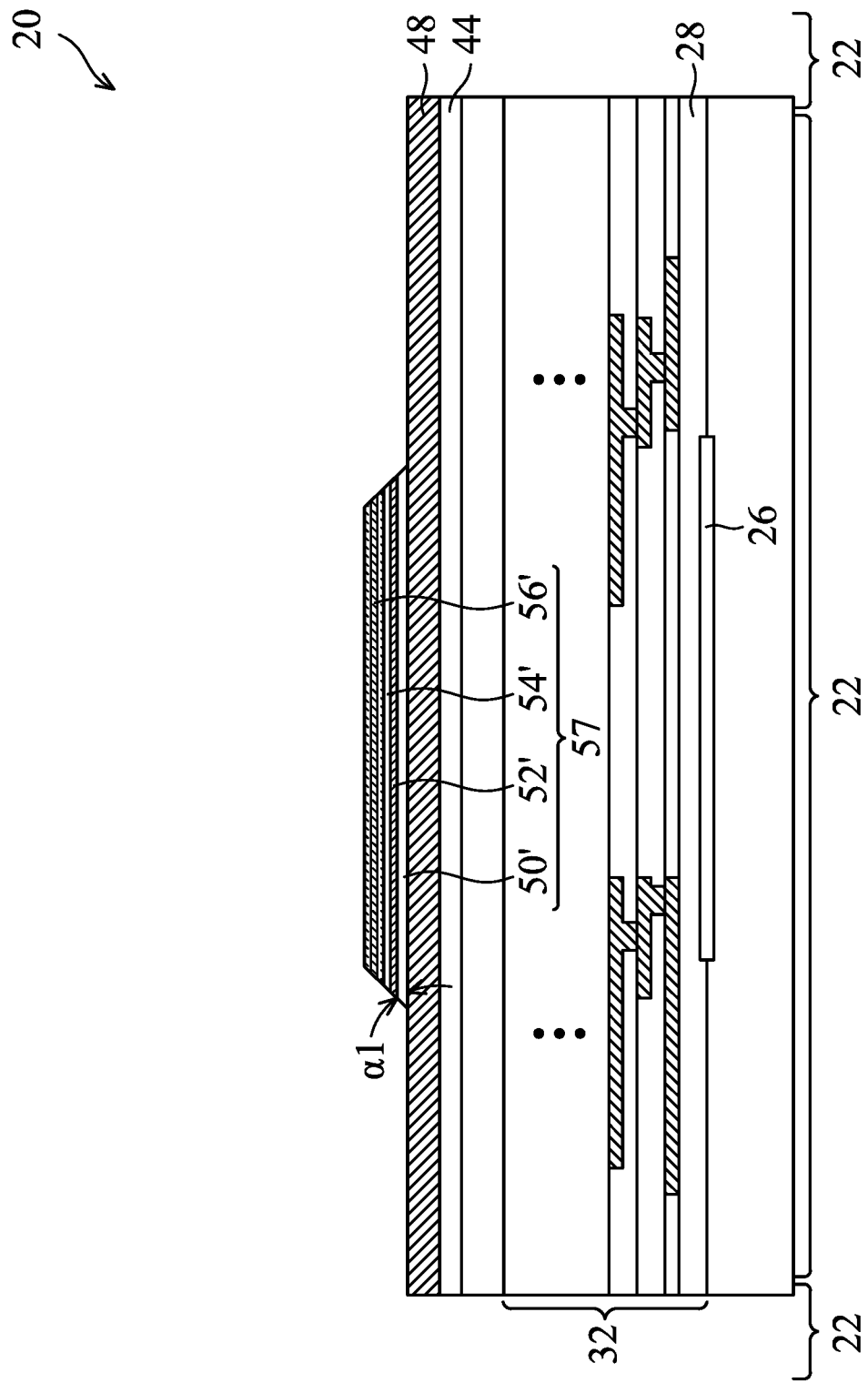

Referring to FIG. 2, etching mask 58 is formed. Etching mask 58 may be a photo resist layer. The top view of etching mask 58 may have an elongated rectangular shape. The stacked layers including adhesion layer 50, dielectric layer 52, etch stop layer 54, and magnetic layers 56 are then etched, with the etching stopping on dielectric layer 48. The respective process is illustrated as process 204 in the process flow shown in FIG. 20. The etching of magnetic layers 56 result in magnetic layers 56', as shown in FIG. 3. In accordance with some embodiments of the present disclosure, magnetic layers 56 are etched using reactive Ion Beam Etching (IBE). The etching may be implemented using Glow Discharge Plasma (GDP), Capacitive Coupled Plasma (CCP), Inductively Coupled Plasma (ICP), or the like. The sidewalls of magnetic layers 56' may be slanted, which is achieved by adjusting the parameter setting of the etching process. In the etching of magnetic layers 56, etch stop layer 54 is used to stop the etching.

After the etching of magnetic layers 56, etch stop layer 54 is etched, forming etch stop layer 54', followed by the etching of dielectric layer 52 and adhesion layer 50 to form dielectric layer 52' and adhesion layer 50', respectively. In accordance with some embodiments, the tilt angle α1 of the stacked layers including magnetic layer 56', and possibly adhesion layer 50', dielectric layer 52', and etch stop layer 54' is in the range between about 40 degrees and about 60 degrees. After the etching, etching mask 58 (FIG. 2) is removed. Throughout the description, adhesion layer 50', dielectric layer 52', etch stop layer 54', and magnetic layers 56' are in combination referred to as stacked layers 57.

Figure 4:
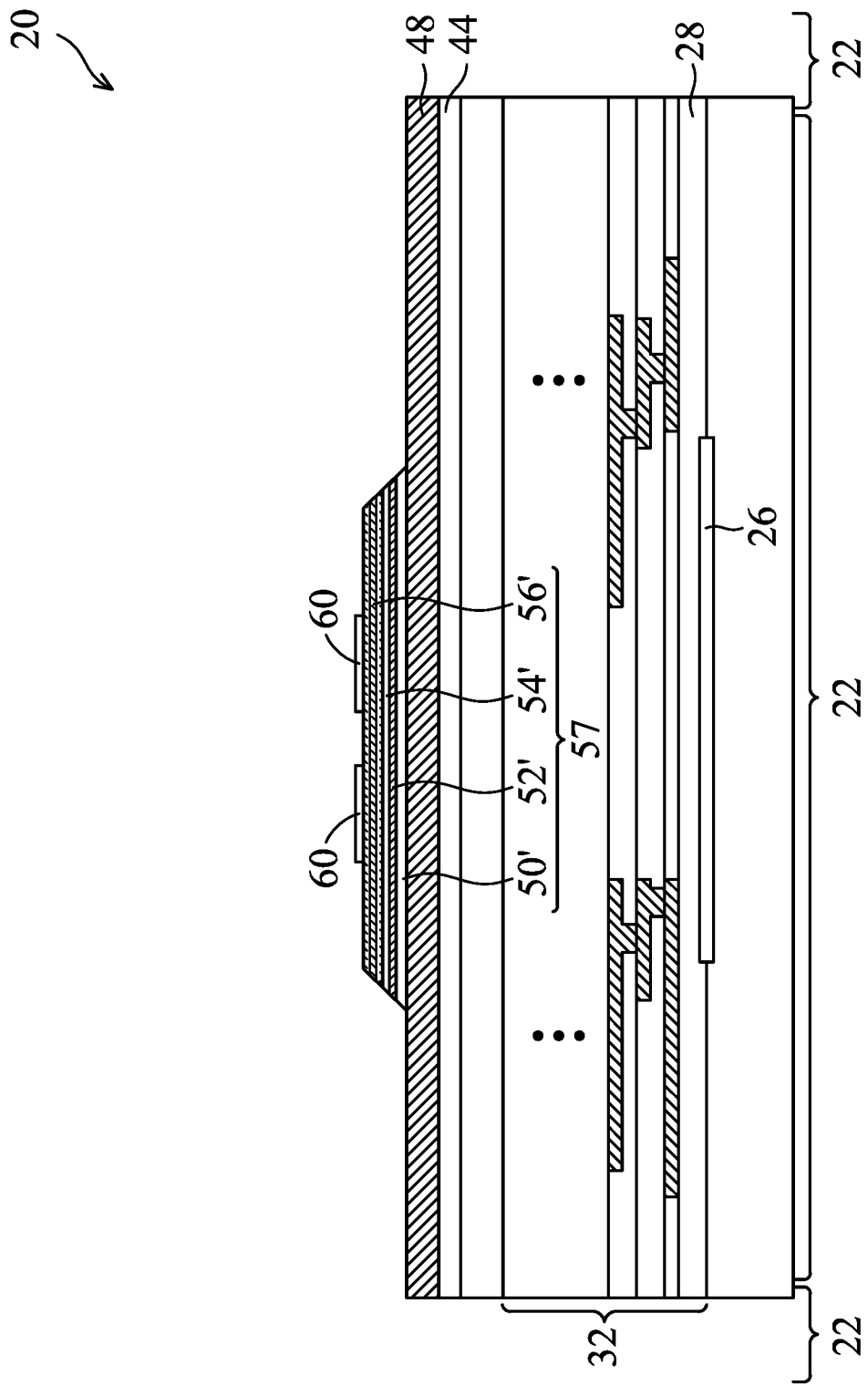

Next, referring to FIG. 4, dielectric layer 60 is formed. The respective process is illustrated as process 206 in the process flow shown in FIG. 20. In accordance with some embodiments of the present disclosure, the formation of dielectric layer 60 includes a blanket deposition process, followed by a patterning process. The remaining portions of dielectric layer 60 include two portions, which may be elongated strips parallel to each other. The cross-sectional shape of dielectric layer 60 is obtained from a plane orthogonal to the longitudinal direction of the strips. Dielectric layer 60 is formed of a dielectric material, which may include silicon nitride, silicon oxide, silicon oxynitride, or the like.

Figure 5:
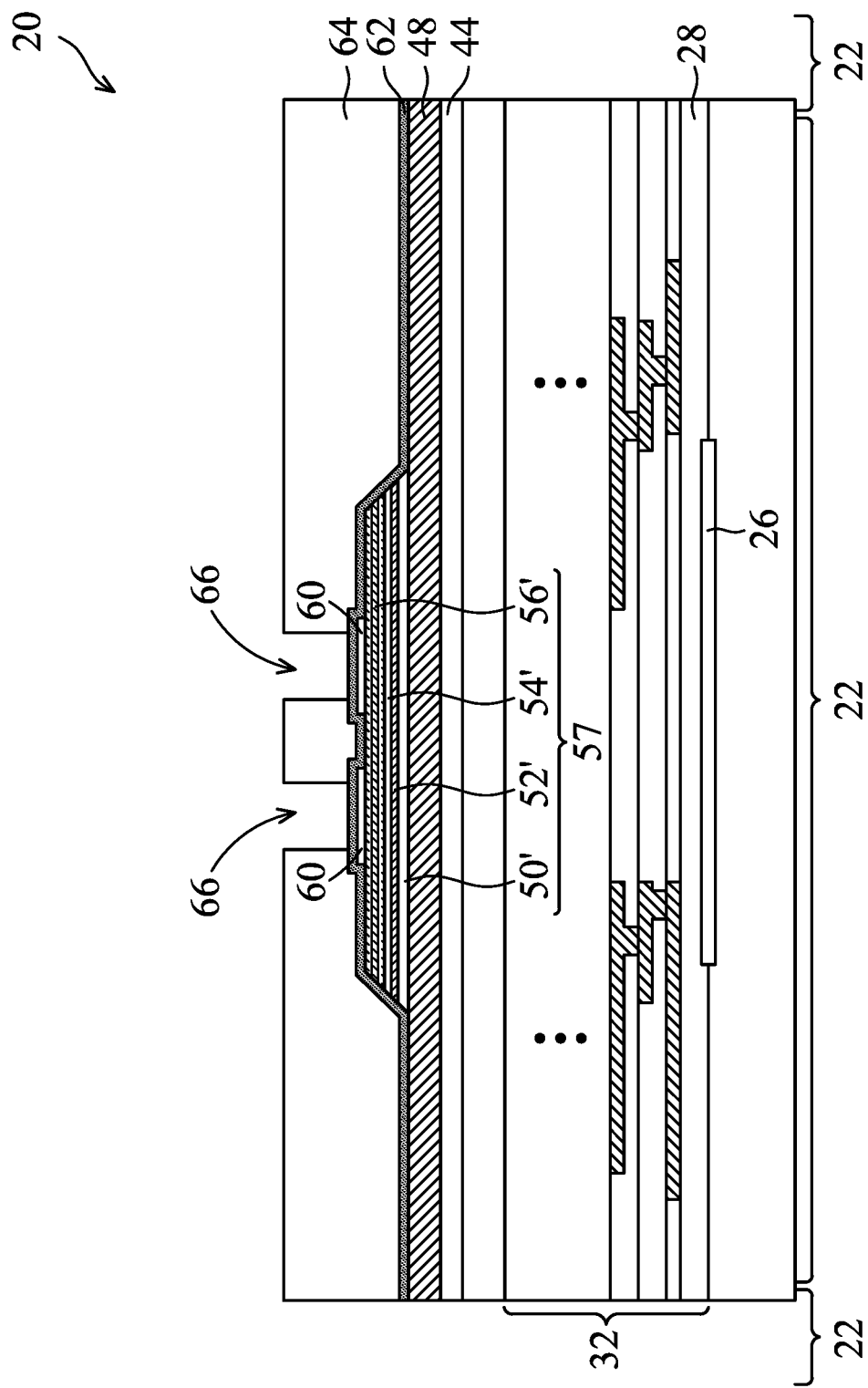
Figure 6:
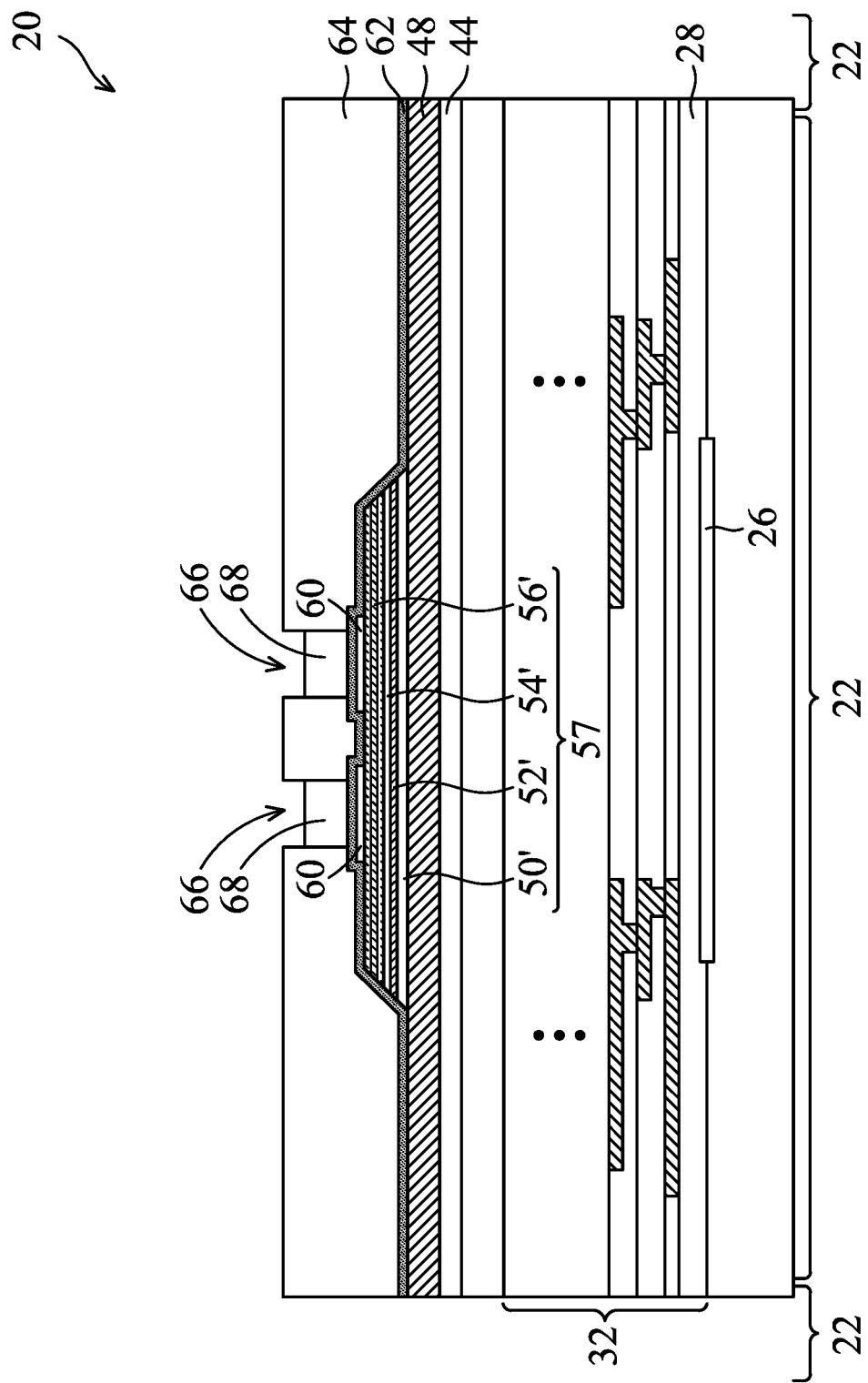
Figure 7:
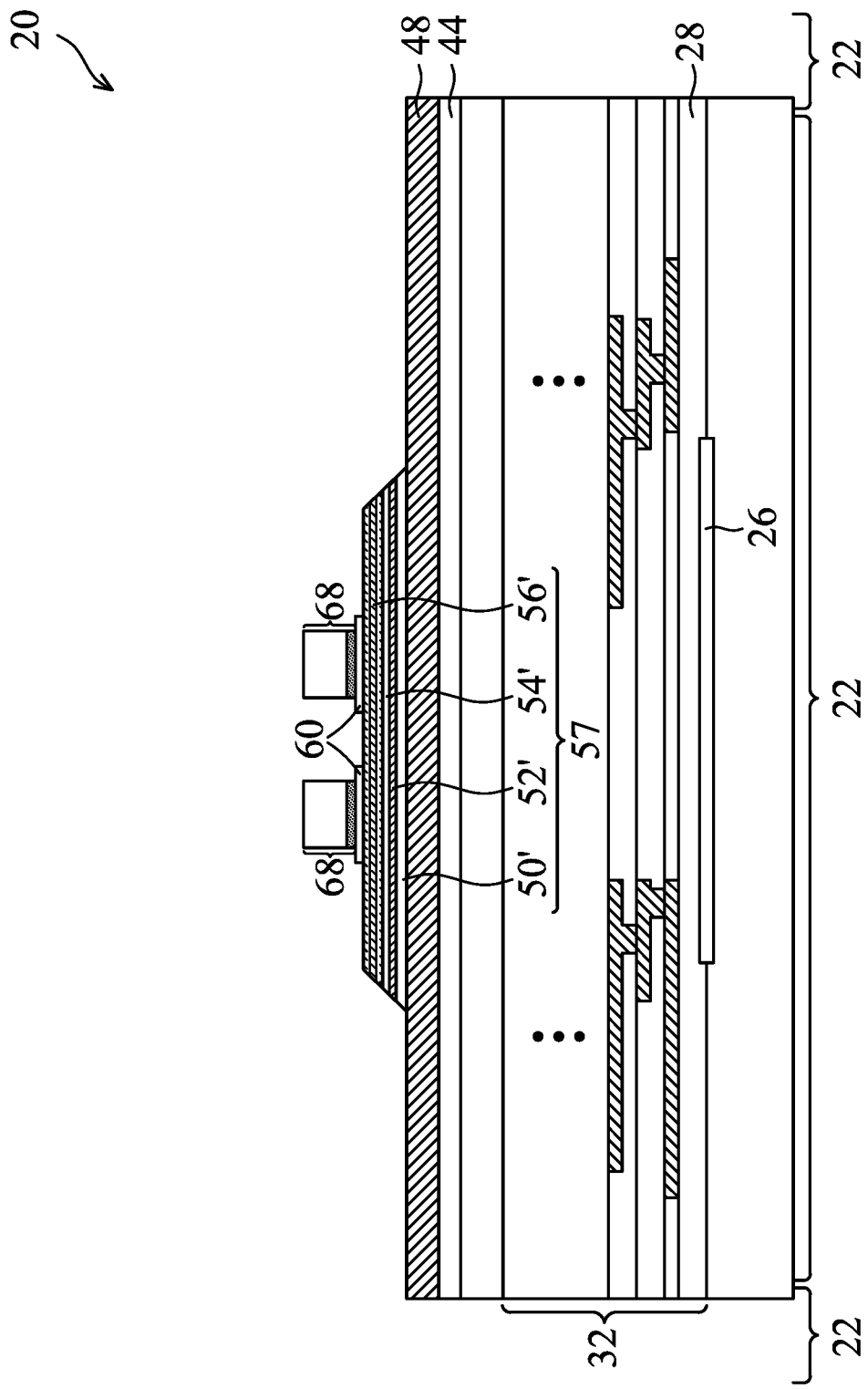

FIGS. 5 through 7 illustrate the formation of conductive traces. The respective process is illustrated as process 208 in the process flow shown in FIG. 20. FIG. 5 illustrates the formation of conductive seed layer 62, which is deposited on the structure shown in FIG. 4. Conductive seed layer 62 may be a metal seed layer. In accordance with some embodiments, conductive seed layer 62 is a composite layer comprising a plurality of layers. For example, conductive seed layer 62 may include a lower layer and an upper layer, wherein the lower layer may include a titanium layer, and the materials of the upper layer may include copper or a copper alloy. In accordance with alternative embodiments, conductive seed layer 62 is a single layer, which may be a copper layer, for example. Conductive seed layer 62 may be formed using Physical Vapor Deposition (PVD), while other applicable methods may also be used.

FIG. 5 further illustrates the formation of plating mask 64. In accordance with some embodiments, plating mask 64 is formed of a photo resist. Plating mask 64 is patterned to form openings 66, through which some portions of conductive seed layer 62 are exposed. Also, the remaining portions of dielectric layer 60 have some portions directly underlying openings 66, and some other portions laterally expanding beyond the edges of the respective overlying openings 66. Next, a plating process is performed to form conductive traces 68, as shown in FIG. 6. Conductive traces 68 may be formed of a metal or a metal alloy such as copper or a copper alloy, or the like.

After the plating process, plating mask 64 is removed in a stripping process. For example, when plating mask 64 is formed of photo resist, plating mask 64 may be ashed using oxygen. The portions of conductive seed layer 62 covered by plating mask 64 is then removed. Next, the exposed portions of conductive seed layer 62 that were previously covered by plating mask 64 are removed through etching, while the portions of conductive seed layer 62 covered by conductive traces 68 remain un-removed. The resulting structure is shown in FIG. 7. Throughout the description, the remaining portions of conductive seed layer 62 are considered as being parts of the conductive traces 68.

Figure 8A:
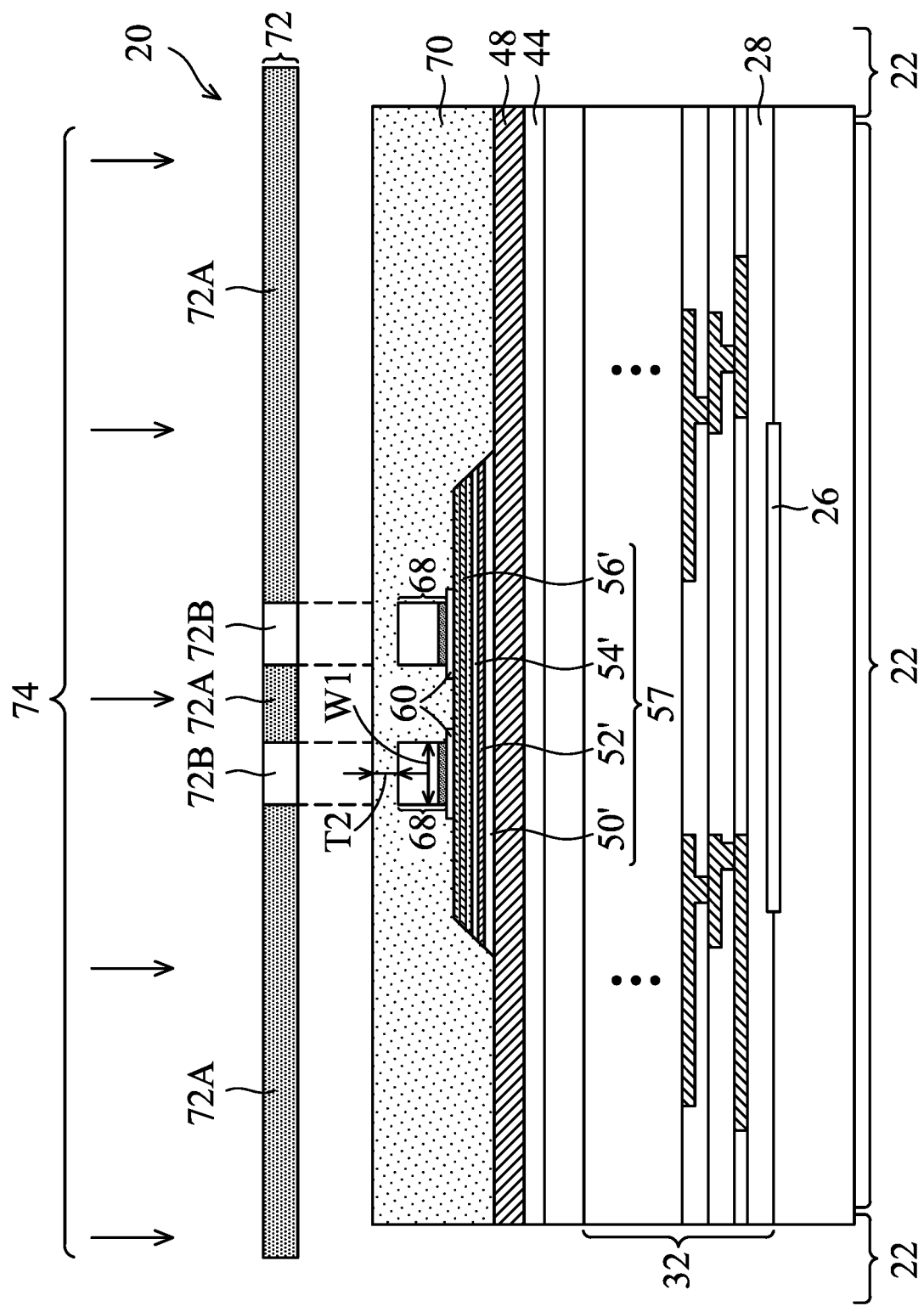
Figure 9:
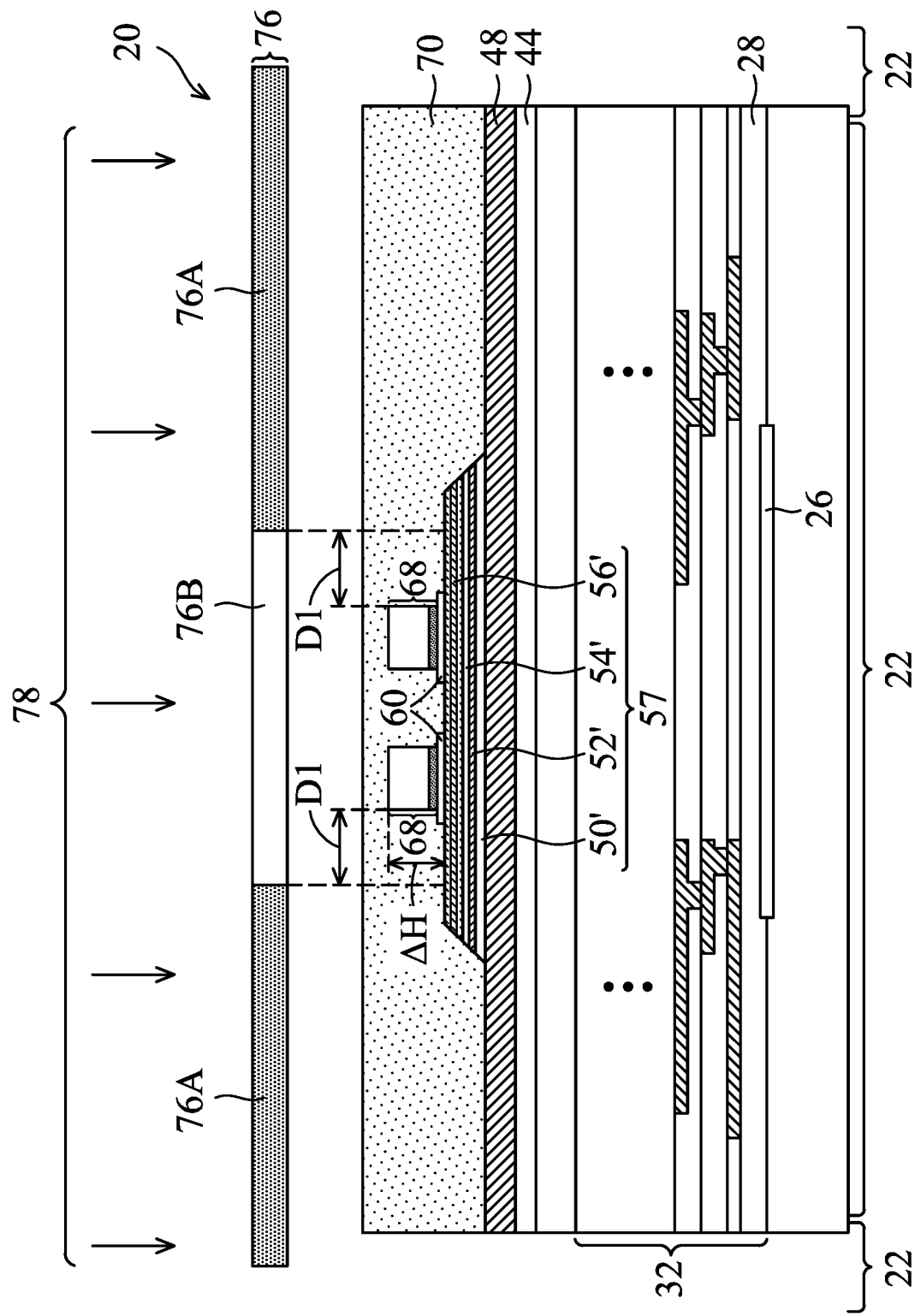

FIG. 8A (or 8B) and FIG. 9 illustrate the coating and a double-exposure process of photo-sensitive coating 70, which is formed of a light-sensitive material. Referring to FIG. 8A, photo-sensitive coating 70 is coated, for example, through spin-on coating. The respective process is illustrated as process 210 in the process flow shown in FIG. 20. In accordance with some embodiments of the present disclosure, photo-sensitive coating 70 is a negative photo resist. For example, photo-sensitive coating 70 may be a negative polyimide. Other negative photo resists (such as photo-sensitive benzocyclobutene (BCB) or photo-sensitive polybenzoxazole (PBO) that have low shrinkage rate during subsequent curing process may also be used. Photo-sensitive coating 70 is sometimes referred to as a second polymer layer (or polymer-2). The top surface of photo-sensitive coating 70 is higher than the top surfaces of conductive traces 68. For example, the thickness T2 of the portion of photo-sensitive coating 70 directly over conductive traces 68 may be in the range between about 4 μm and about 8 μm in accordance with some embodiments. Thickness T2 is selected to that the thickness T3 in the final structure shown in FIG. 14 may fall into the range between about 3 μm and about 6 μm, as discussed in subsequent paragraphs.

Further referring to FIG. 8A, lithograph mask 72 is placed over package component 20. Lithograph mask 72 includes opaque portions 72A for blocking light, and transparent portions 72B allowing light to pass through. In accordance with some embodiments, two of the transparent portions 72B have edges flush with (or substantially flush with) the respective edges of conductive traces 68, with the offset (if any) of the corresponding edges being smaller than about 1 µm. The offset, if any, may be smaller than about 20 percent of the width W1 of conductive traces 68. One of the opaque portions 72A is vertically aligned to the portion of photo-sensitive coating 70 between conductive traces 68. A light exposure is performed using light beam 74, so that the portions of photo-sensitive coating 70 directly under transparent portions 72B are exposed. The respective process is illustrated as process 212 in the process flow shown in FIG. 20. As a result, these portions of photo-sensitive coating 70 are cross-linked.

Figure 8B:
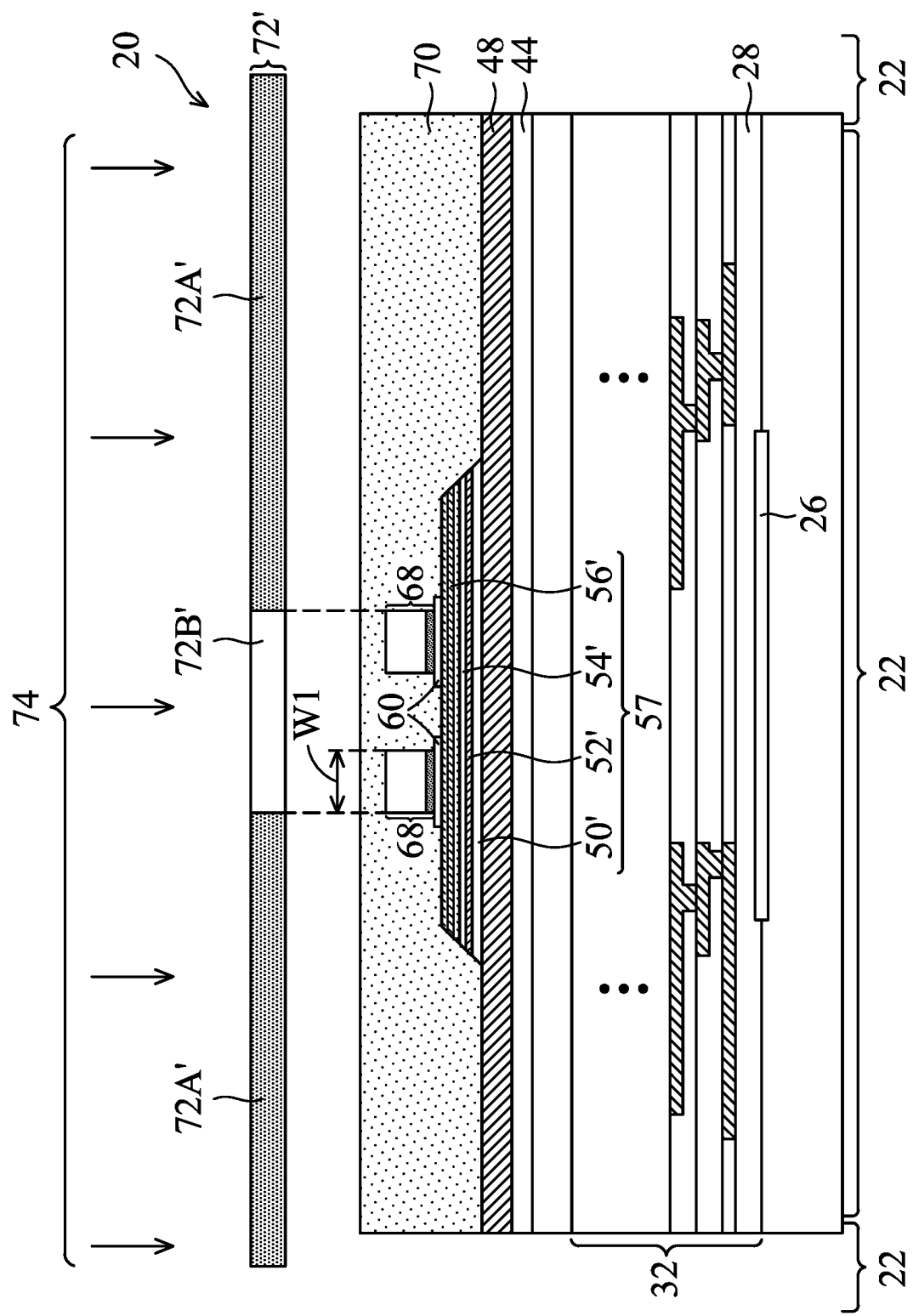

FIG. 8B illustrates the exposure of photo-sensitive coating 70 in accordance with some other embodiments. Lithograph mask 72' is placed over package component 20. Lithograph mask 72' includes opaque portions 72A' for blocking light, and transparent portion 72B' allowing light to pass through. In accordance with some embodiments, transparent portion 72B' covers conductive traces 68 and the portions of photo-sensitive coating 70 between conductive traces 68. The opposite edges of transparent portion 72B' are also flush with (or substantially flush with so that the offset is smaller than about 1 nm) the respective edges of conductive traces 68. The offset, if any, is also smaller than about 20 percent of the width W1 of conductive traces 68. A light exposure is performed using light beam 74, so that the portions of photo-sensitive coating 70 directly over conductive traces 68 and the portion of photo-sensitive coating 70 between conductive traces 68 are exposed. As a result, these portions of photo-sensitive coating 70 are cross-linked.

The light-exposure process as shown in FIG. 8A or 8B is referred to as a first light-exposure process of a double-exposure process. FIG. 9 illustrates a second light-exposure process of the double-exposure process. The respective process is illustrated as process 214 in the process flow shown in FIG. 20. It is appreciated that the order of the first light-exposure process and the second light-exposure process may be inversed. In the second light-exposure process, lithograph mask 76 is placed over package component 20. Lithograph mask 76 includes opaque portions 76A and transparent portion 76B. In accordance with some embodiments, transparent portion 76B covers conductive traces 68 and the portions of photo-sensitive coating between conductive traces 68. Opaque portions 76A further laterally extends beyond the respective outer edges of conductive traces 68 by lateral distance D1. In accordance with some embodiments of the present disclosure, lateral distance D1 is greater than about 10 µm, and may be in the range between about 10 µm and about 30 µm. Also, lateral distance D1 is equal to or greater than the height difference ΔH between the top surfaces of conductive traces 68 and the top surface of magnetic layer 56'. A light exposure is performed using light beam 78, so that the portions of photo-sensitive coating 70 directly under transparent portion 76B is exposed. As a result, these portions of photo-sensitive coating 70 are cross-linked.

It is appreciated that the patterns of the lithography masks 72 (FIG. 8A), 72' (FIG. 8B), and 76 (FIG. 9) are designed for exposing negative photo-sensitive coating 70. In accordance with other embodiments, a positive photo-sensitive coating may be used, and in order to expose the positive photo-sensitive coating, the patterns of opaque portions and transparent portions of the corresponding lithography masks may be inverted than the respective lithography mask 72, 72', and 76.

Figure 10:
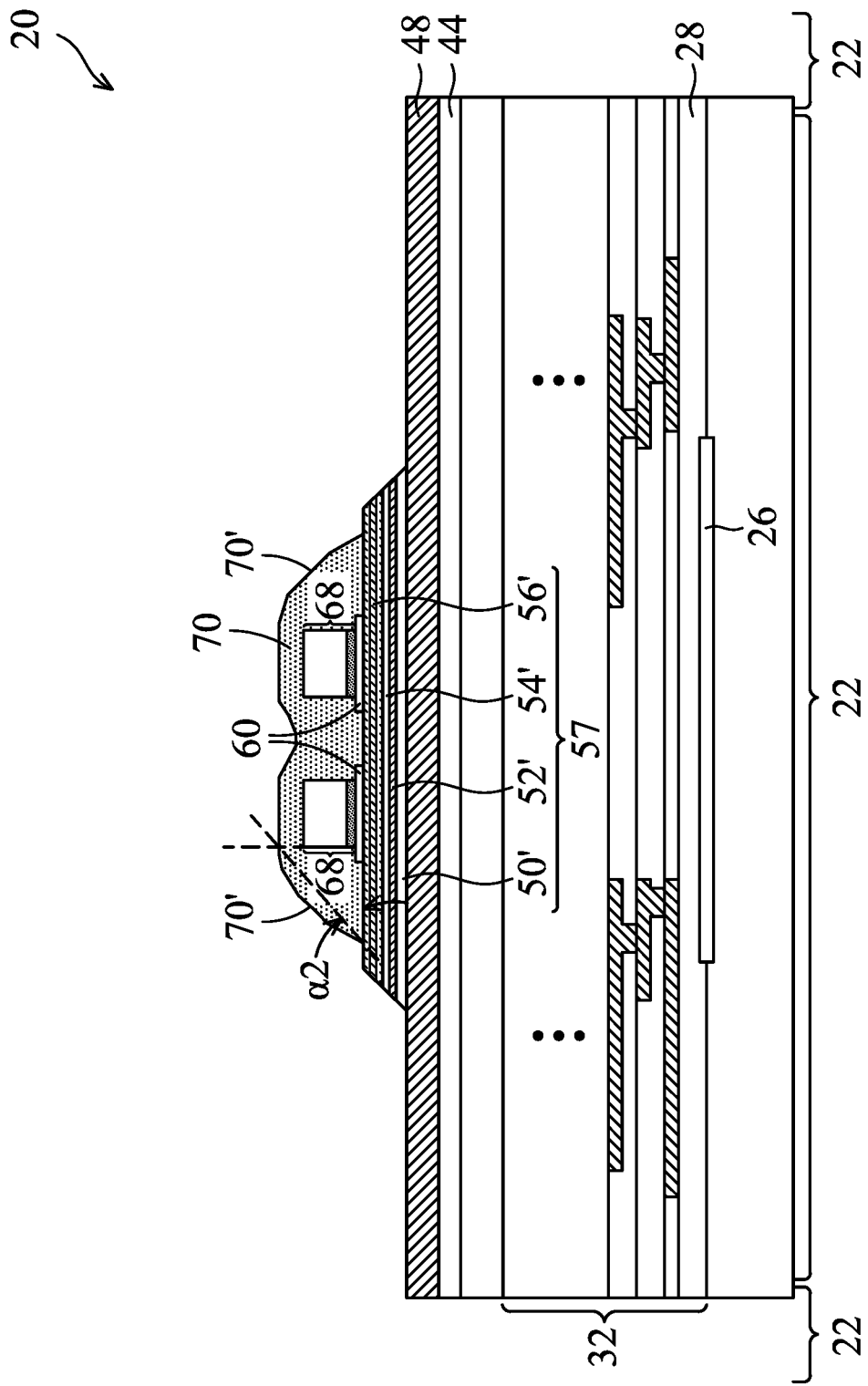

By using the double-exposure process, a continuous portion of photo-sensitive coating 70 is cross-linked. The cross-linked portion is shown in FIG. 10, and the un-cross-linked portion and under-cross-linked portions are not shown in FIG. 10. The formation of the profile of the cross-linked portion is discussed briefly as follows referring to FIGS. 18 and 19.

Figure 18:
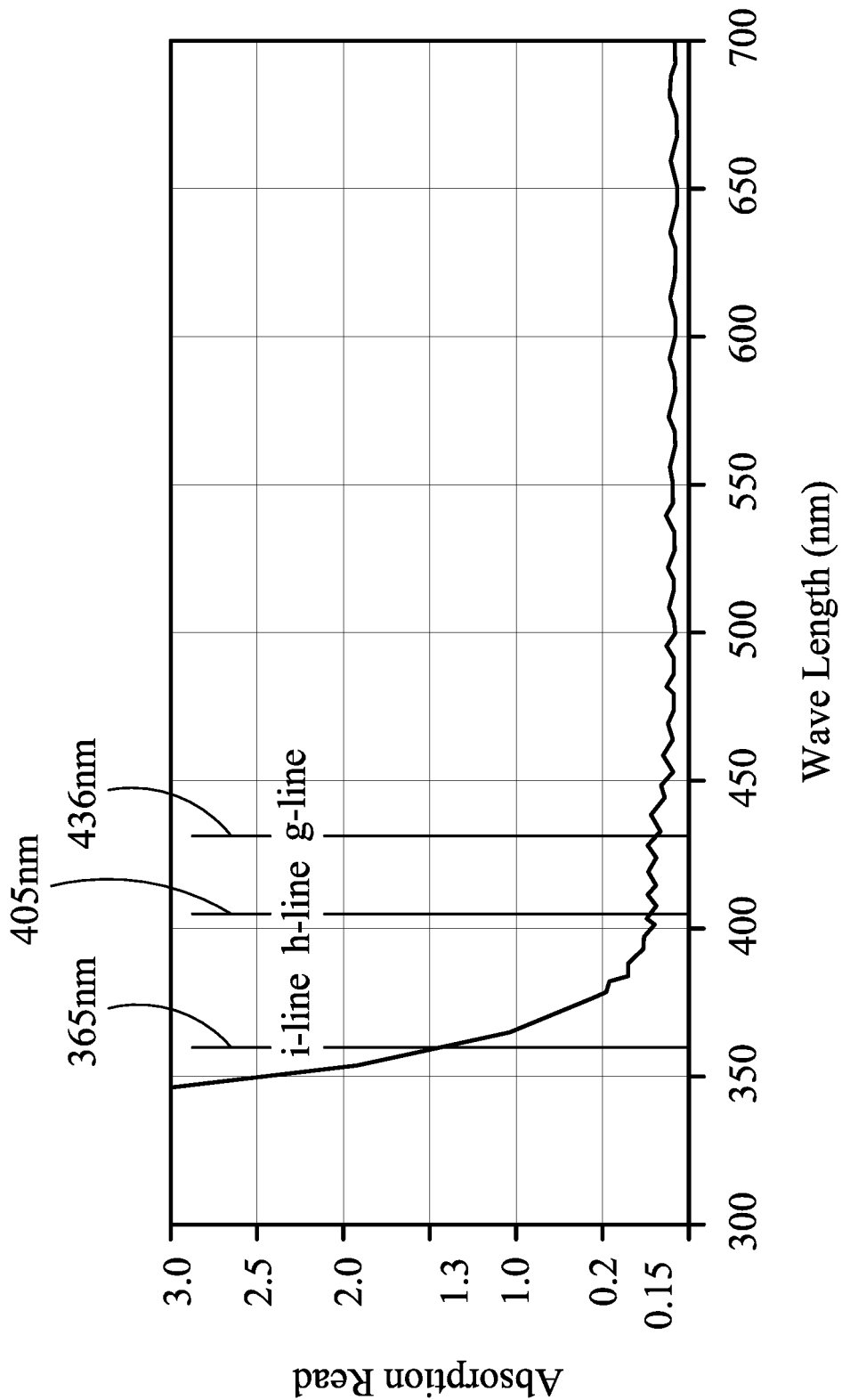
FIGS. 18 and 19 illustrate the absorption of photo-sensitive materials as a function of wavelengths in accordance with some embodiments.

FIG. 18 illustrates the normalized absorption rate of light energy in light-sensitive coating 70 as a function of the wavelengths of the light beams used for the light exposure. The most likely wavelengths for broadband UV-lithography are in a range between 300 nm and 450 nm, which includes the characteristic wavelengths of high-pressure mercury lamp at 436 nm (g-line), 405 nm (h-line) and 365 nm (i-line). As shown in FIG. 18, the i-line has the highest absorption rate, and with the increase in the wavelengths, the absorption rate generally decreases. Also, according to Beer-Lambert law, the intensity of an electromagnetic wave inside a material falls off exponentially from the surface into the material.

Figure 19:
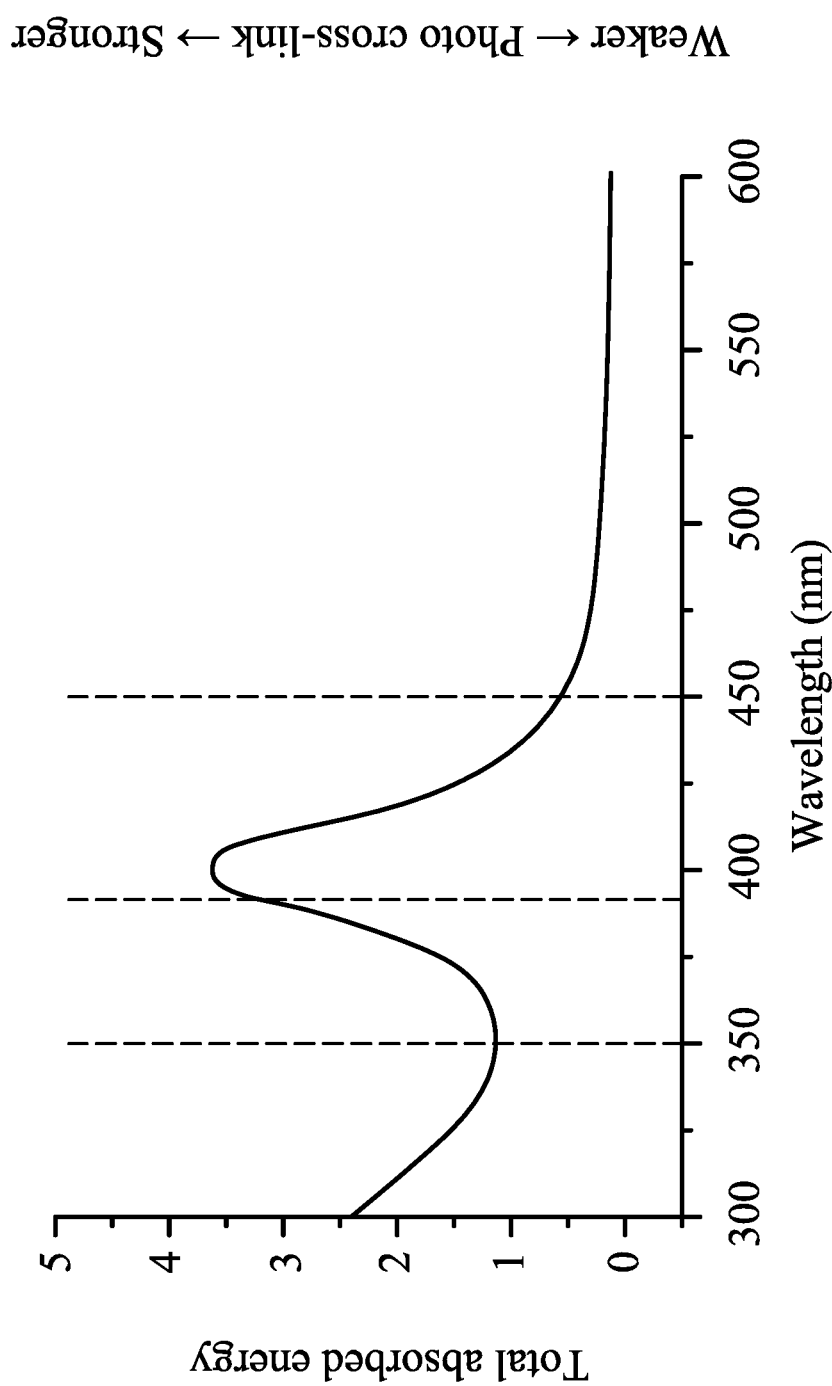

FIG. 19 illustrates the total absorbed energy as a function of wavelengths, which indicates the efficiency in the absorption of the light energy when light beams with different wavelengths are used. The amount of the absorbed energy also indicates the amount of cross-links generated in the exposed photo-sensitive coating, and the more energy is absorbed, the more cross-links are generated, and vice versa. Also, FIG. 19 indicates that the penetration ability of light beam increases with the increase in wavelength, and decreases with the decrease in wavelength. Accordingly, to ensure that the portions of photo-sensitive coating 70 directly over conductive traces 68 are well cross-linked (so that these portions are not removed in subsequent development process), the first light-exposure process (FIG. 8A or 8B) uses the light beam 74 having the wavelength between about 350 nm and about 450 nm, and the light may include any, two of, or all three of i-line, g-line, and h-line wavelengths (FIG. 18). If the wavelength is longer than 450 nm, the cross-linked portion of photo-sensitive coating 70 directly over conductive traces 68 will be too thin. If the wavelength is shorter than 350 nm, the cross-linked portion of photo-sensitive coating 70 directly over conductive traces 68 will be too thick. The first light-exposure is mainly for defining the thickness of the cross-linked portion of photo-sensitive coating 70.

The second exposure (FIG. 9) is mainly for defining the profile of the cross-linked portion of photo-sensitive coating 70, so that the tapered edges as shown in FIG. 10 may be generated. The second light-exposure process uses the light beam 78 (FIG. 9) having the wavelength between about 390 nm and about 450 nm, and the light may have the spectrum mainly including g-line and h-line wavelengths, but not including the i-line. If the wavelength is longer than 450 nm, the slant edges would be too tapered. If the wavelength is shorter than 390 nm, the slant edges would be too vertical.

Each of the first light beam 74 and second light beam 78 may be a laser beam having a single wavelength, which falls in the aforementioned range. Each of the first light beam 74 and second light beam 78 may include wavelengths spanning across a range, which is in aforementioned range. The corresponding light beam 74 or 78 thus may include multiple wavelengths in the aforementioned range.

After the first and the second light exposure processes as shown in FIGS. 8A (or 8B) and 9, the light-exposed photo-sensitive coating 70 is developed. The respective process is illustrated as process 216 in the process flow shown in FIG. 20. The un-cross linked portions and under-cross-linked portions are removed, and the adequately cross-linked portions remain. The resulting photo-sensitive coating 70 is illustrated in FIG. 10. FIG. 10 shows that the outer portions of photo-sensitive coating 70 on the outer sides of conductive traces 68 have slanted sidewalls 70'. The tilt angle α2 of slanted sidewalls 70' is lesser than about 45 degrees, and may be in the range between about 20 degrees and about 50 degrees. The top surface of photo-sensitive coating 70 has two substantially planar portions directly over conductive traces 68, and a recessed portion between the two substantially planar portions.

Figure 11:
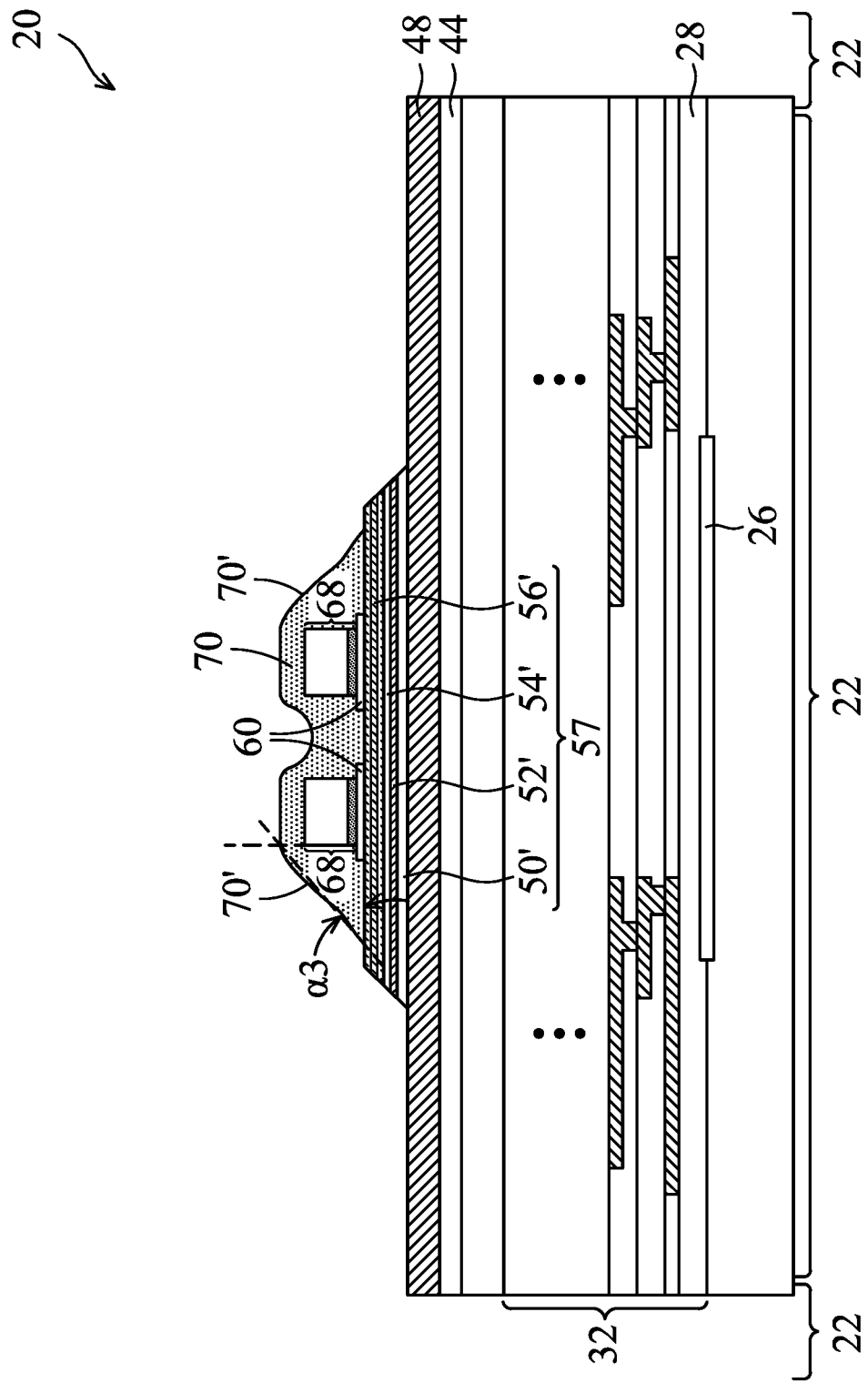

FIG. 11 illustrates the photo-sensitive coating 70 after a curing process is performed. The respective process is illustrated as process 218 in the process flow shown in FIG. 20. In accordance with some embodiments, the curing process includes a thermal curing process, which is performed at a temperature in a range between about 180° C. and about 350° C. The curing duration may be in the range between about 20 minutes and about 240 minutes. As a result of the curing process, photo-sensitive coating 70 is fully solidified and shrinks. Furthermore, the portions of photo-sensitive coating 70 directly over conductive traces 68 may be shrunk less due to better cross-linking, and the outer portions of photo-sensitive coating 70 farther away from conductive traces 68 shrink more due to worse cross-link. As a result, the tilt angle α3 of slanted sidewalls 70' is reduced to be smaller than angle α2 (FIG. 10). In accordance with some embodiments of the present disclosure, tilt angle α3 is smaller than 40 degrees, and may be in the range between about 10 degrees and about 40 degrees.

With tilt angle α3 being smaller than about 40 degrees, the subsequently deposited magnetic layer formed on the slanted sidewalls 70' will have better coverage than on the otherwise vertical sidewalls. Otherwise, if tilt angle α3 is greater than 40 degrees, the subsequently formed magnetic layer may not have acceptable conformity. Also, small tilt angle α3 results in smaller stress being generated by the cured photo-sensitive coating 70. On the other hand, tilt angel α3 cannot be too small, for example, smaller than about 35 degrees. Otherwise, the sidewalls 70' may adversely extend to the sidewalls of (rather than over) conductive traces 68. In accordance with some embodiments, to make tilt angle α3 to fall into the desirable range, the light spectrum of light beams 74 and 78 (FIGS. 8A, 8B, and 9), the exposure energy, and the patterns of lithography masks 72, 72' and 76 may be adjusted.

Figure 12:
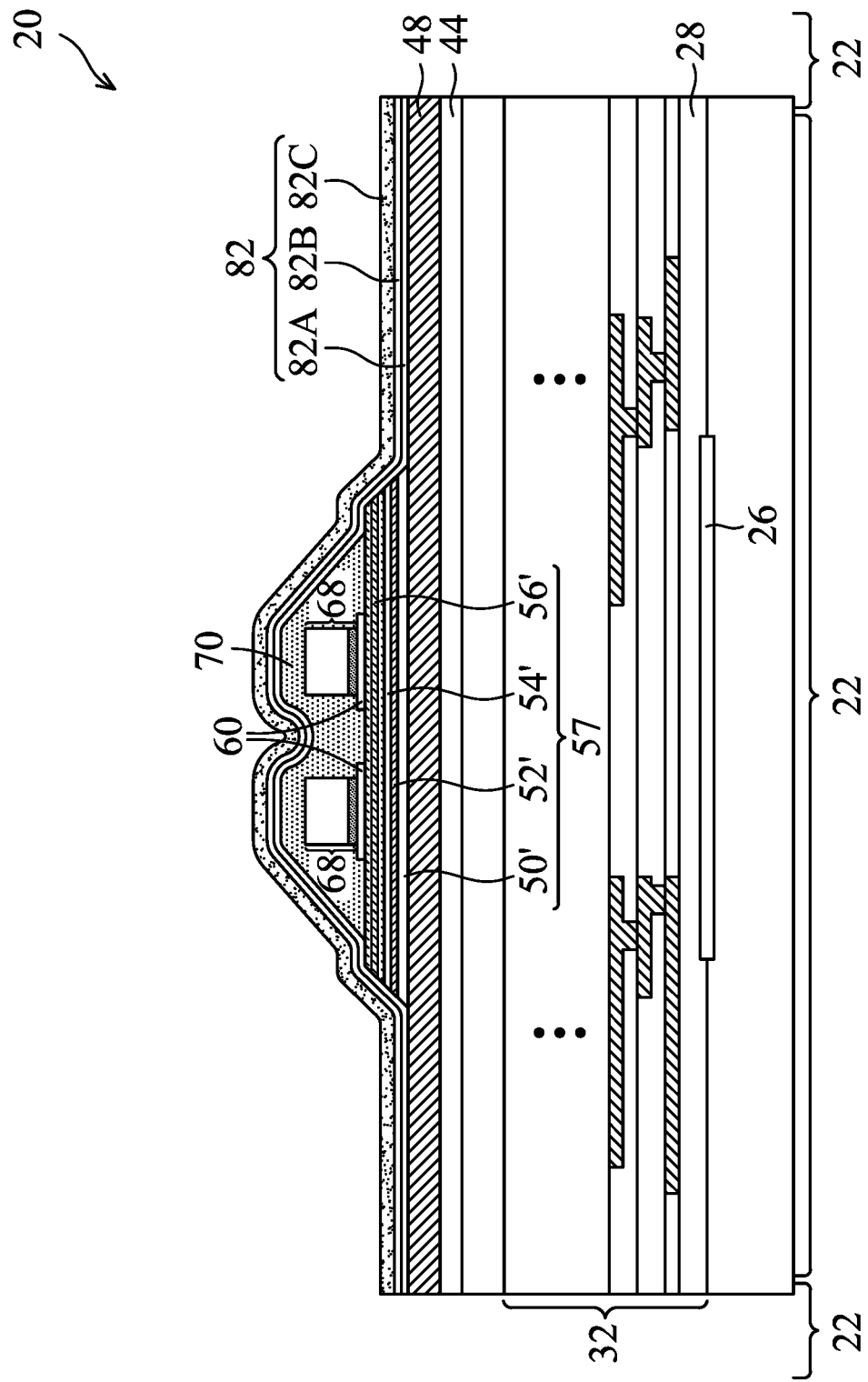

FIG. 12 illustrates the deposition of stacked layers 82. The respective process is illustrated as process 220 in the process flow shown in FIG. 20. In accordance with some embodiments of the present disclosure, stacked layers 82 includes adhesion layer 82A, dielectric layer 82B, an etch stop layer (not shown) over dielectric layer 82B, and magnetic layers 82C over the etch stop layer. The candidate materials and formation methods for forming adhesion layer 82A, dielectric layer 82B, the etch stop layer, and magnetic layers 82C may be essentially the same as that of adhesion layer 50, dielectric layer 52, etch stop layer 54, and magnetic layers 56 (FIG. 1), respectively. The details are thus not repeated herein. The coverage and conformity of stacked layers 82 are improved due to the well-controlled slanted edges of photo-sensitive coating 70.

Figure 13:
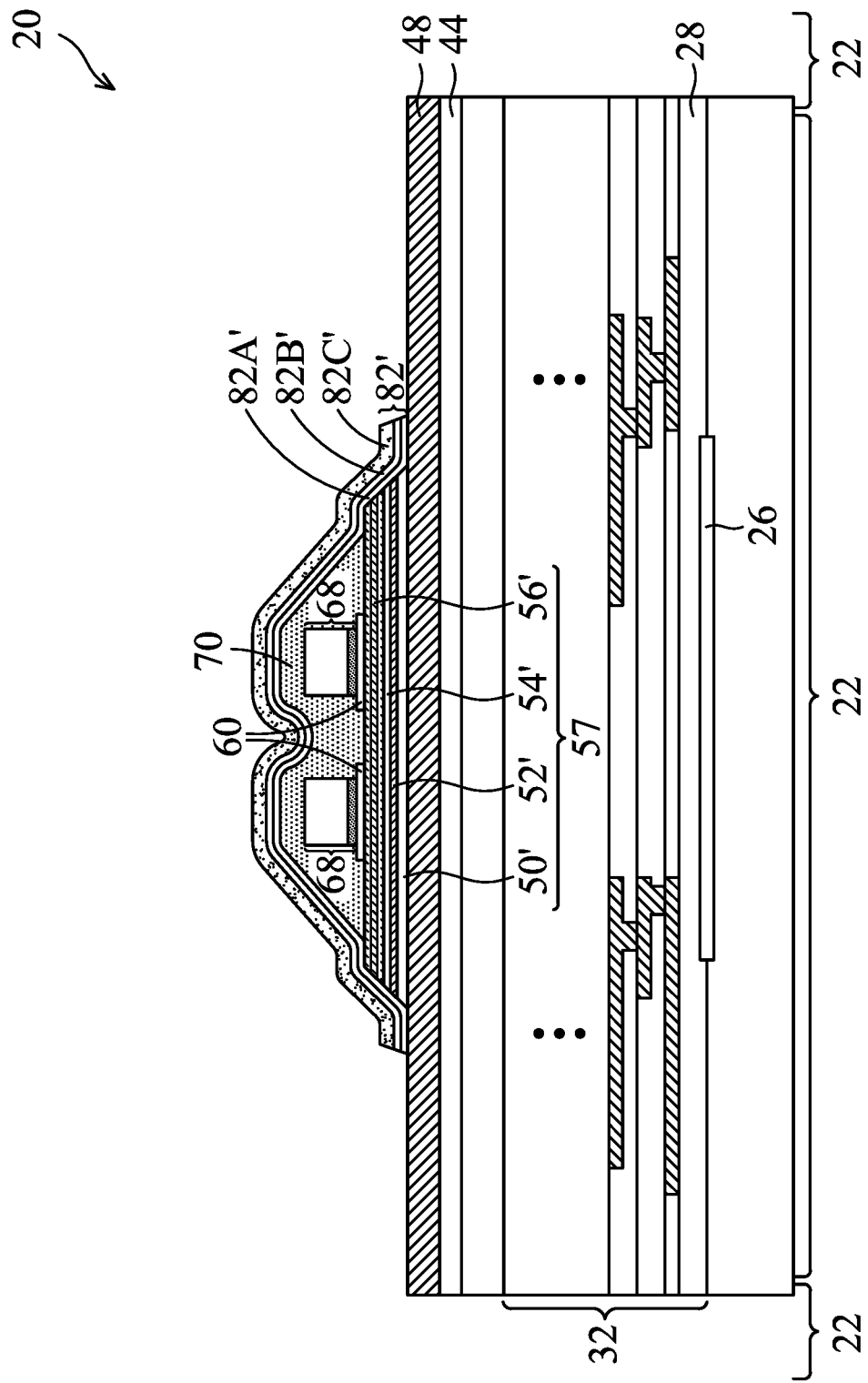

FIG. 13 illustrates the patterning of stacked layer 82, which is achieved through etching, hence forming stacked layers 82', which includes adhesion layer 82A', dielectric layer 82B', an etch stop layer, and magnetic layers 82C'. The respective process is illustrated as process 222 in the process flow shown in FIG. 20. Magnetic layers 82C' are magnetically coupled to magnetic layers 56' through dielectric layer 82B', and magnetic layers 82C' and magnetic layers 56' in combination form a shell, which can improve the inductance of the resulting inductor.

Figure 14:
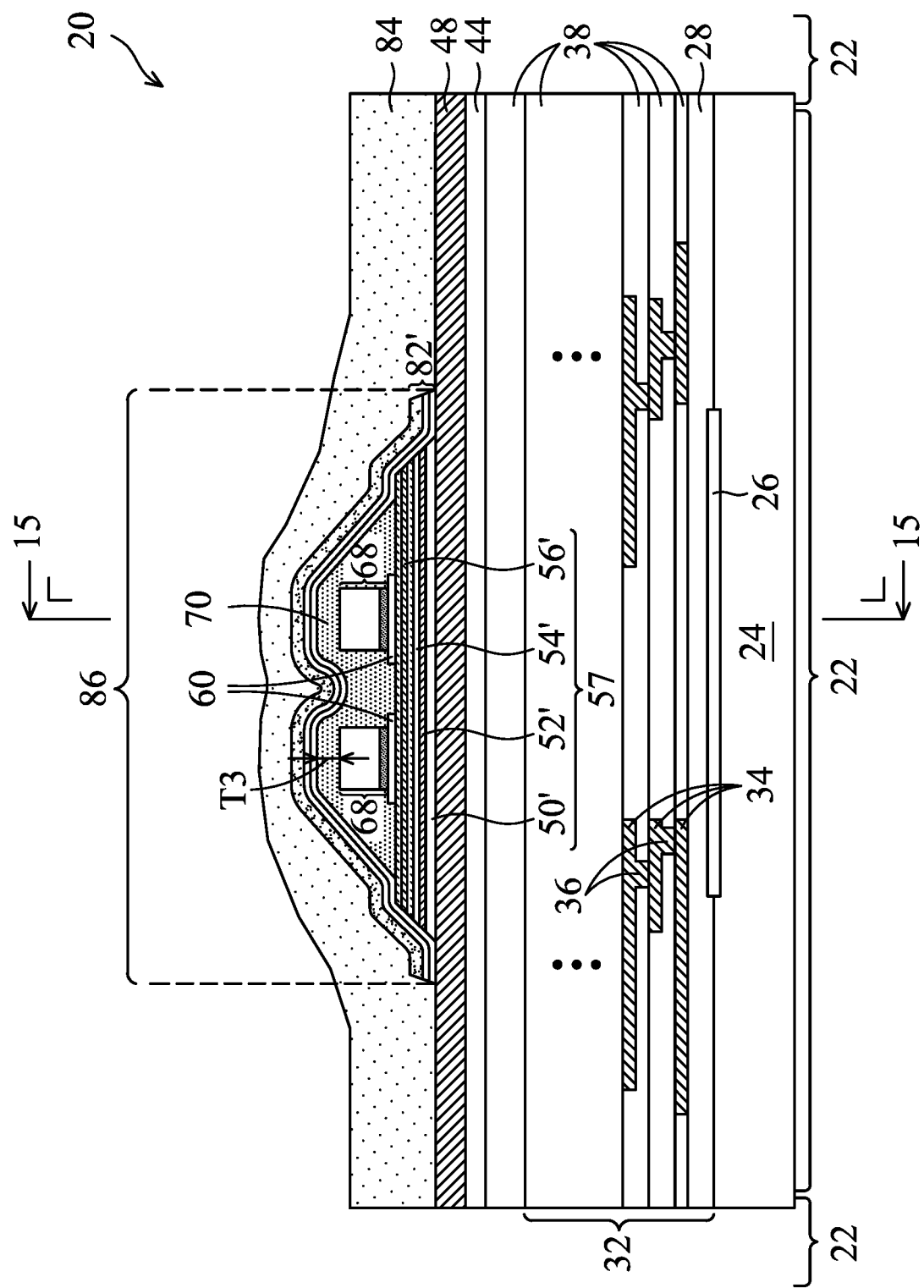

Next, as shown in FIG. 14, dielectric layer 84 is formed. The respective process is illustrated as process 224 in the process flow shown in FIG. 20. In accordance with some embodiments of the present disclosure, dielectric layer 84 is formed of a polymer such as polyimide, polybenzoxazole (PBO), benzocyclobutene (BCB), or the like. Dielectric layer 84 is thus sometimes referred to as a third polymer layer (or polymer-3). Conductive traces 68 and the magnetic shell formed of magnetic layers 56' and 82' in combination form inductor 86. The inductance of inductor 86 is improved due to the interaction of conductive traces 68 and the magnetic shell 56'/82'. In subsequent processes, electrical connectors (such as solder regions 94 and Under-Bump Metallurgies 92 in FIG. 16) may be formed, and package components 20 may be singulated into individual dies 22.

Referring again to FIG. 14, the portions of photo-sensitive coating 70 directly over conductive traces 68 have thickness T3. Thickness T3 cannot be too large. Otherwise, the resulting inductance of inductor 86 is too small. Thickness T3 cannot be too small either. Otherwise, the resulting inductance of inductor 86 is too large and the reliability of inductor 86 is degraded. In accordance with some embodiments of the present disclosure, thickness T3 is in the range between about 3 μm and about 6 μm.

Figure 15:
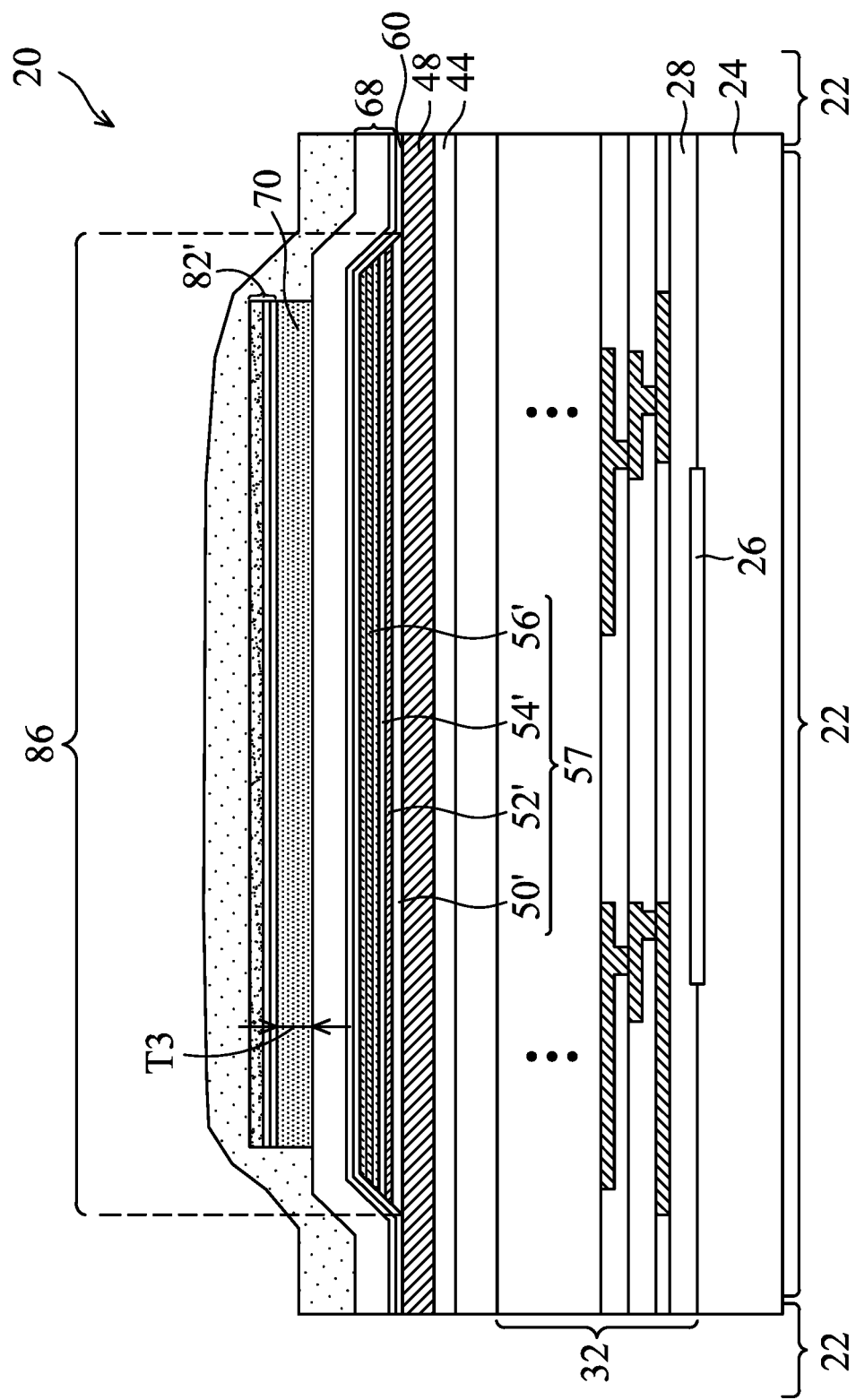
FIG. 15 illustrates another cross-sectional view of an inductor in accordance with some embodiments.

FIG. 15 illustrates a cross-section of the reference plane 15-15 as shown in FIG. 14. FIG. 15 illustrates the lengthwise direction of conductive trace 68. FIGS. 14 and 15 in combination show the shape of the shell formed of magnetic layers 56' and 82'.

Figure 16:
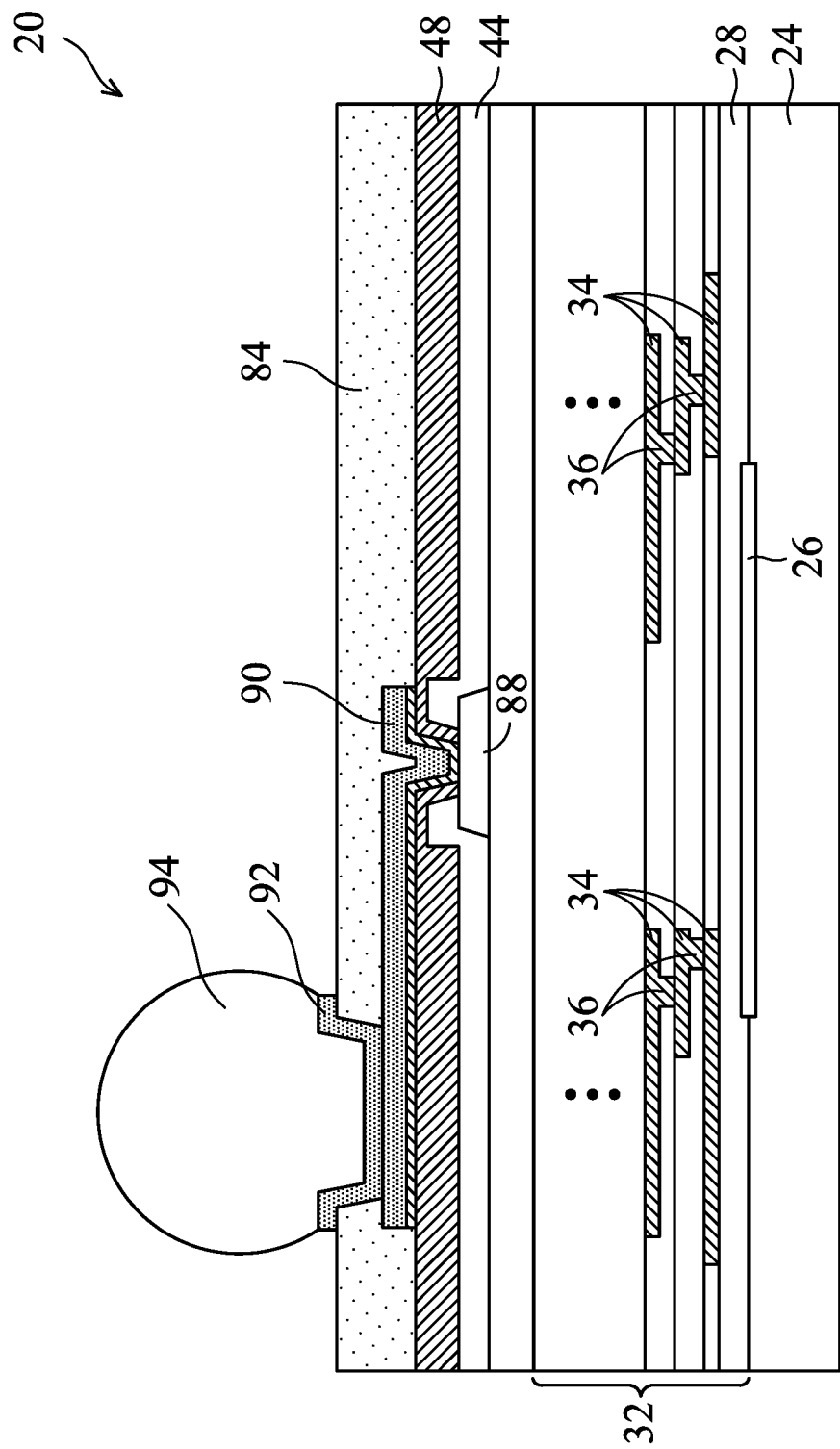
FIG. 16 illustrates a cross-sectional view of a package component showing a metal bump in accordance with some embodiments.

FIG. 16 illustrates a region of package component 22, in which no inductor is formed. Accordingly, the combination of FIGS. 14 and 16 reveal where inductor 86 is located in package component 22 with relative to other features such as solder regions, metal pads, and dielectric layers. FIG. 16 illustrates metal pad 88, which may be an aluminum pad, formed in passivation layer 44 and under dielectric layer 48 (polymer-1). Conductive trace 90, which is also referred to as a Post-Passivation Interconnect (PPI), extends into dielectric layer 48. A portion of conductive trace 90 is formed over dielectric layer 48. Dielectric layer 84 is formed over dielectric layer 48. Inductor 86 is inserted between dielectric layers 48 and 84 in another region that is shown in FIG. 14. UBM 92 is formed to extend into dielectric layer 84. Electrical connector 94 is formed on UBM 92. Electrical connector 94 may be a solder region, a metal pillar, a metal pillar plus an overlying solder layer, or the like.

Figure 17:
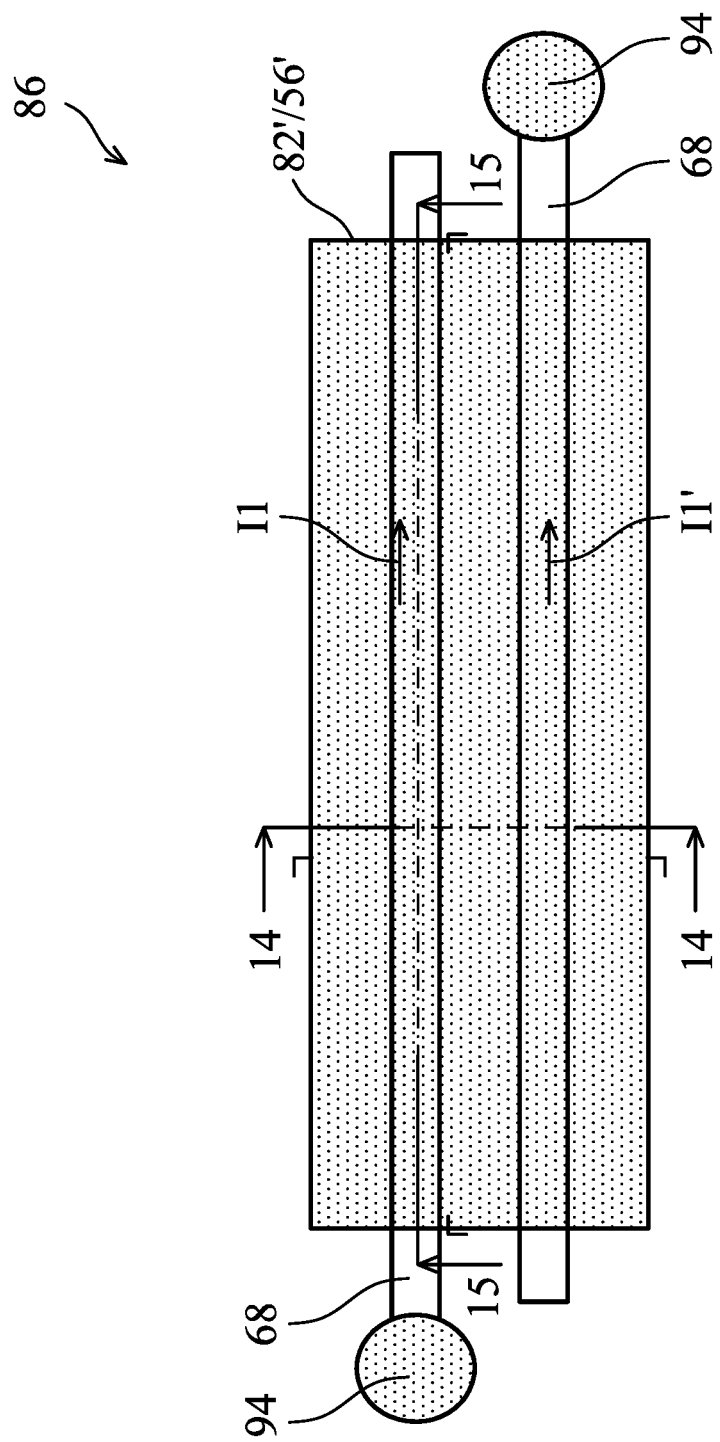
FIG. 17 illustrates a top view of an inductor in accordance with some embodiments.

FIG. 17 illustrates a top view of inductor 86, with FIG. 14 illustrating a cross-section of the reference plane 14-14 in FIG. 17, and FIG. 15 illustrating a cross-section of the reference plane 15-15 in FIG. 17. In accordance with some embodiments, current I1 may flow into a first conductive trace 68, routed into underlying layers, and flow into a second conductive trace 68 as current I1'. The inductance of inductor 86 is enhanced by the magnetic shell 82'/56'.

The embodiments of the present disclosure have some advantageous features. Co—Zr—Ta films have exhibited fewer resistive losses and a lower permeability, while maintaining a higher saturation magnetization. The present disclosure reveals a method and the corresponding inductor including a magnetic shell, which may be formed of Co—

Zr—Ta films. The profile of the dielectric layer in the inductor is patterned through a double-exposure process, followed by a single development process, so that the tilt angle of the sidewalls of dielectric layer is in a desirable range. This improves the coverage and the conformity of the magnetic layers over the dielectric layer. Also, with the tapered sidewalls of the dielectric layer, the stress in the resulting structure is reduced. Experiment results have revealed that if a two-sub-layer dielectric layer formed using two-coating, two-exposure and two-development process is adopted, the profile of the resulting two-sub-layer dielectric layer is unable to achieve the small tilt angle α3. Also, the stress of the device die including the two-layer dielectric layer will be greater, and the respective wafer will have greater warpage, which may be around 600 μm. By using the embodiments of the present disclosure, the wafer warpage is reduced to about 400 μm.

In accordance with some embodiments of the present disclosure, a method of forming an integrated circuit structure includes forming a first magnetic layer; forming a first conductive line over the first magnetic layer; coating a photo-sensitive coating on the first magnetic layer, wherein the photo-sensitive coating comprises a first portion directly over the first conductive line; and a second portion offset from the first conductive line, wherein the first portion is joined to the second portion; performing a first light-exposure on the first portion of the photo-sensitive coating; performing a second light-exposure on both the first portion and the second portion of the photo-sensitive coating; developing the photo-sensitive coating; and forming a second magnetic layer over the photo-sensitive coating. In an embodiment, the first light-exposure is performed using a first lithography mask; and the second light-exposure is performed using a second lithography mask different from the first lithography mask. In an embodiment, the first light-exposure is performed using a first wavelength, and the second light-exposure is performed using a second wavelength different from the first wavelength. In an embodiment, the first wavelength is shorter than the second wavelength. In an embodiment, the method further includes forming a second conductive line over the first magnetic layer, wherein the first conductive line and the second conductive line are parallel to each other, and wherein the second conductive line is coated in the photo-sensitive coating. In an embodiment, in both the first light-exposure and the second light-exposure, an intermediate portion of the photo-sensitive coating between the first conductive line and the second conductive line is light-exposed. In an embodiment, in the first light-exposure, an intermediate portion of the photo-sensitive coating between the first conductive line and the second conductive line is not light-exposed, and in the second light-exposure, the intermediate portion of the photo-sensitive coating is light-exposed. In an embodiment, the first magnetic layer, the first conductive line, and the second magnetic layer form parts of an inductor. In an embodiment, the coating the photo-sensitive coating comprises coating a negative photo resist. In an embodiment, the forming the first magnetic layer comprises depositing a cobalt layer; depositing a zirconium layer over the cobalt layer; and depositing a tantalum layer over the zirconium layer.

In accordance with some embodiments of the present disclosure, a method of forming an integrated circuit structure, the method includes forming a first conductive line and a second conductive line; coating a photo-sensitive coating, which includes first portions directly over the first conductive line and the second conductive line; a second portion between the first conductive line and the second conductive line; third portions on opposite sides of a combined region, wherein the combined region comprises the first conductive line, the second conductive line, and the second portion of the photo-sensitive coating; performing a first light-exposure to expose the first portions of the photo-sensitive coating, wherein the first light-exposure is performed using a first light beam having a first wavelength; performing a second light-exposure to expose the first portions and the third portions of the photo-sensitive coating, wherein the second light-exposure is performed using a second light beam having a second wavelength different from the first wavelength; and developing the photo-sensitive coating. In an embodiment, the method further includes depositing a first magnetic layer, wherein the first conductive line and the second conductive line are overlapping the first conductive line and the second conductive line; and forming a second magnetic layer over the photo-sensitive coating and the first magnetic layer. In an embodiment, the first conductive line and the second conductive line are parts of an inductor. In an embodiment, the coating the photo-sensitive coating comprises coating a negative photo resist. In an embodiment, the first wavelength is in a range between about 350 nm and about 450 nm, and the second wavelength is in a range between about 390 nm and about 450 nm.

In accordance with some embodiments of the present disclosure, an integrated circuit structure includes a first magnetic layer; a first conductive line and a second conductive line over the first magnetic layer and parallel to each other; and a dielectric layer comprising first portions directly over the first conductive line; a second portion between the first conductive line and the second conductive line; and third portions on opposite sides of a combined region, wherein the combined region comprises the first conductive line, the second conductive line, and the second portion of the dielectric layer, wherein sidewalls of the third portions are slanted with slant angles being smaller than about 40 degrees. In an embodiment, the dielectric layer is formed of a negative photo resist. In an embodiment, the first portions of the dielectric layer have a thickness in a range between about 3 μm and about 6 μm. In an embodiment, the first magnetic layer is formed of cobalt, zirconium, and tantalum. In an embodiment, the dielectric layer is formed of a homogenous material, with no distinguishable interface inside the dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an integrated circuit structure, the method comprising:
    forming a first magnetic layer;
    forming a first conductive line over the first magnetic layer;
    coating a photo-sensitive coating on the first magnetic layer, wherein the photo-sensitive coating comprises:
        a first portion directly over the first conductive line; and a second portion offset from the first conductive line, wherein the first portion is joined to the second portion;

performing a first light-exposure on the first portion of the photo-sensitive coating;

performing a second light-exposure on both the first portion and the second portion of the photo-sensitive coating;

developing the photo-sensitive coating; and forming a second magnetic layer over the photo-sensitive coating.

2. The method of claim 1, wherein:

the first light-exposure is performed using a first lithography mask; and the second light-exposure is performed using a second lithography mask different from the first lithography mask.

3. The method of claim 1, wherein the first light-exposure is performed using a first wavelength, and the second light-exposure is performed using a second wavelength different from the first wavelength.

4. The method of claim 3, wherein the first wavelength is shorter than the second wavelength.

5. The method of claim 1 further comprising:

forming a second conductive line over the first magnetic layer, wherein the first conductive line and the second conductive line are parallel to each other, and wherein the second conductive line is coated in the photo-sensitive coating.

6. The method of claim 5, wherein in both the first light-exposure and the second light-exposure, an intermediate portion of the photo-sensitive coating between the first conductive line and the second conductive line is light-exposed.

7. The method of claim 5, wherein in the first light-exposure, an intermediate portion of the photo-sensitive coating between the first conductive line and the second conductive line is not light-exposed, and in the second light-exposure, the intermediate portion of the photo-sensitive coating is light-exposed.

8. The method of claim 1, wherein the first magnetic layer, the first conductive line, and the second magnetic layer form parts of an inductor.

9. The method of claim 1, wherein the coating the photo-sensitive coating comprises coating a negative photo resist.

10. The method of claim 1, wherein the forming the first magnetic layer comprises:

depositing a first magnetic film;

depositing a second magnetic film over the first magnetic film; and depositing a third magnetic film over the second magnetic film, wherein the first magnetic film, the second magnetic film, and the third magnetic film are formed of different materials.

11. A method of forming an integrated circuit structure, the method comprising:

forming a first conductive line and a second conductive line;

coating a photo-sensitive coating comprising:

first portions directly over the first conductive line and the second conductive line;

a second portion between the first conductive line and the second conductive line;

third portions on opposite sides of a combined region, wherein the combined region comprises the first conductive line, the second conductive line, and the second portion of the photo-sensitive coating;

performing a first light-exposure to expose the first portions of the photo-sensitive coating, wherein the first light-exposure is performed using a first light beam having a first wavelength;

performing a second light-exposure to expose the first portions and the third portions of the photo-sensitive coating, wherein the second light-exposure is performed using a second light beam having a second wavelength different from the first wavelength; and developing the photo-sensitive coating.

12. The method of claim 11 further comprising:

depositing a first magnetic layer, wherein the first conductive line and the second conductive line are overlapping the first magnetic layer; and forming a second magnetic layer over the photo-sensitive coating and the first magnetic layer.

13. The method of claim 12, wherein the first conductive line and the second conductive line are parts of an inductor.

14. The method of claim 11, wherein the coating the photo-sensitive coating comprises coating a negative photo resist.

15. The method of claim 11, wherein the first wavelength is in a range between about 350 nm and about 450 nm, and the second wavelength is in a range between about 390 nm and about 450 nm.

16. A method of forming an integrated circuit structure, the method comprising:

forming a first conductive line and a second conductive line;

dispensing a photo-sensitive coating covering the first conductive line and the second conductive line;

performing a first light-exposure process using a first lithography mask having a first pattern;

performing a second light-exposure process using a second lithography mask having patterns different from the first lithography mask, wherein portions of the photo-sensitive coating directly over the first conductive line and the second conductive line are exposed in both of the first light-exposure process and the second light-exposure process;

developing the photo-sensitive coating; and depositing a magnetic layer over the photo-sensitive coating.

17. The method of claim 16, wherein the first conductive line and the second conductive line are deposited over a first magnetic layer.

18. The method of claim 16, wherein the first conductive line and the second conductive line are parts of an inductor.

19. The method of claim 16, wherein the dispensing the photo-sensitive coating comprises coating a negative photo resist, wherein after the photo-sensitive coating is developed, there are portions of the photo-sensitive coating directly over the first conductive line and the second conductive line remaining.

20. The method of claim 16, wherein the first light-exposure process and the second light-exposure process are performed using light beams with different wavelengths.

* * * * *